(12) United States Patent
Gupta et al.

(10) Patent No.: US 6,331,805 B1
(45) Date of Patent: Dec. 18, 2001

(54) ON-CHIP LONG JOSEPHSON JUNCTION (LJJ) CLOCK TECHNOLOGY

(75) Inventors: Deepnarayan Gupta, Hawthorne, NY (US); Yongming Zhang, San Diego, CA (US)

(73) Assignees: Hypres, Inc., Elmsford, NY (US); Conductus, Inc, Sunnyvale, CA (US)

( * ) Notice: Subject to any disclaimer, the term of this patent is extended or adjusted under 35 U.S.C. 154(b) by 0 days.

(21) Appl. No.: 09/599,734

(22) Filed: Jun. 22, 2000

Related U.S. Application Data

(60) Provisional application No. 60/174,694, filed on Jan. 6, 2000.

(51) Int. Cl.[7] ............... H03B 15/00; H03K 3/38; H01L 39/22

(52) U.S. Cl. ............ 331/107 S; 327/528; 505/853

(58) Field of Search ............ 331/107 S; 327/528; 505/853, 854

(56) References Cited

U.S. PATENT DOCUMENTS 4,181,902 * 1/1980 Scott ............... 331/107 S

* cited by examiner

*Primary Examiner*—Siegfried H. Grimm
(74) *Attorney, Agent, or Firm*—Henry I. Schanzer

(57) ABSTRACT

One aspect of the invention is directed to on-chip high-frequency, low-jitter clock circuits including long Josephson junction (LJJ) oscillators usable as clock sources. LJJ oscillators embodying the invention may be formed using either "linear" or "annular" long Josephson junctions. This invention enables the generation and distribution of a stable high-frequency on-chip single flux quantum (SFQ) clock. The on-chip clock circuit may include a clock selector circuit and a clock distribution scheme and may be integrated with RSFQ circuits and/or with a wideband analog-to-digital converter (ADC) comparator. The invention also includes a new fluxon "sender" circuit suitable for synchronizing the LJJ oscillator with another oscillator, either on-chip or external to the chip. The new sender circuit may also enable the realization of a novel phase-locked loop (PLL) circuit.

26 Claims, 35 Drawing Sheets

$f_0 = 13.52$ GHz $f_0 = 12.95$ GHz

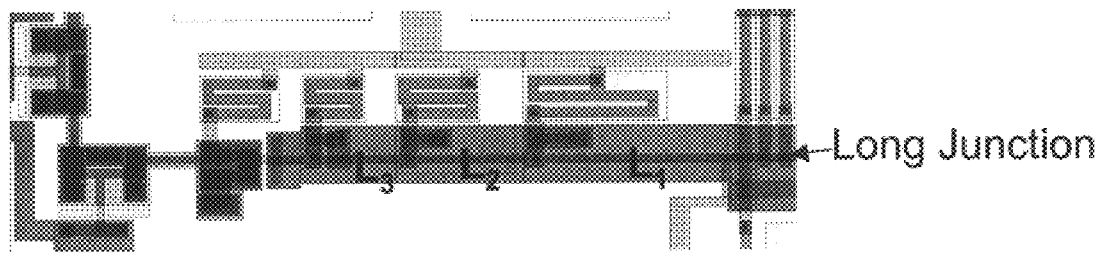
Fig. 3A1

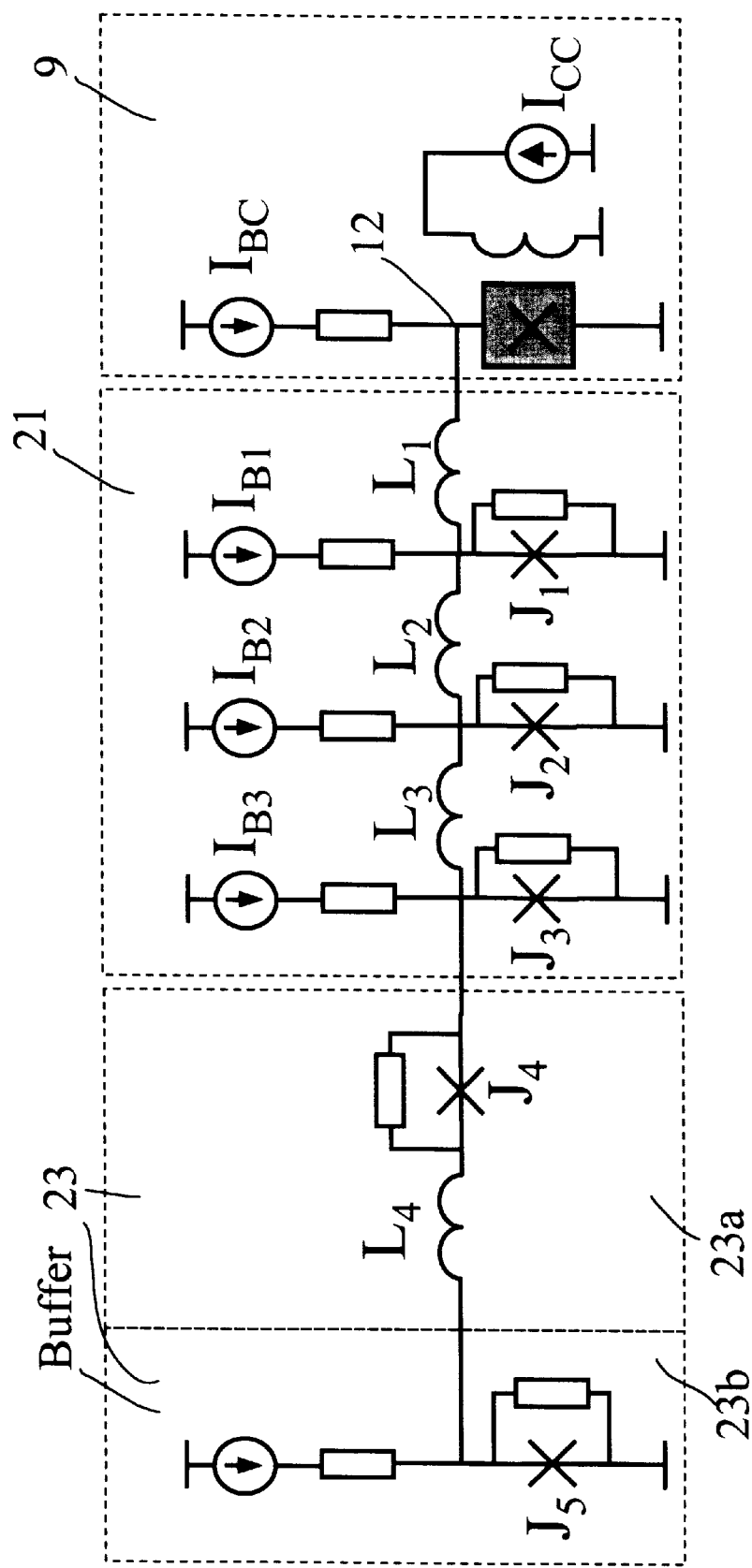
Fig. 3A2

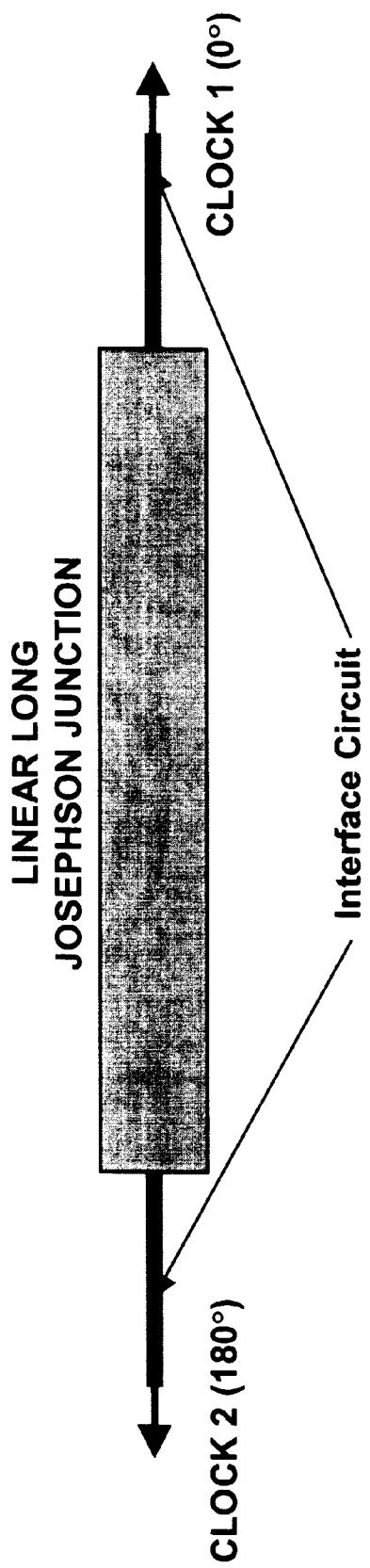
Fig. 3B1

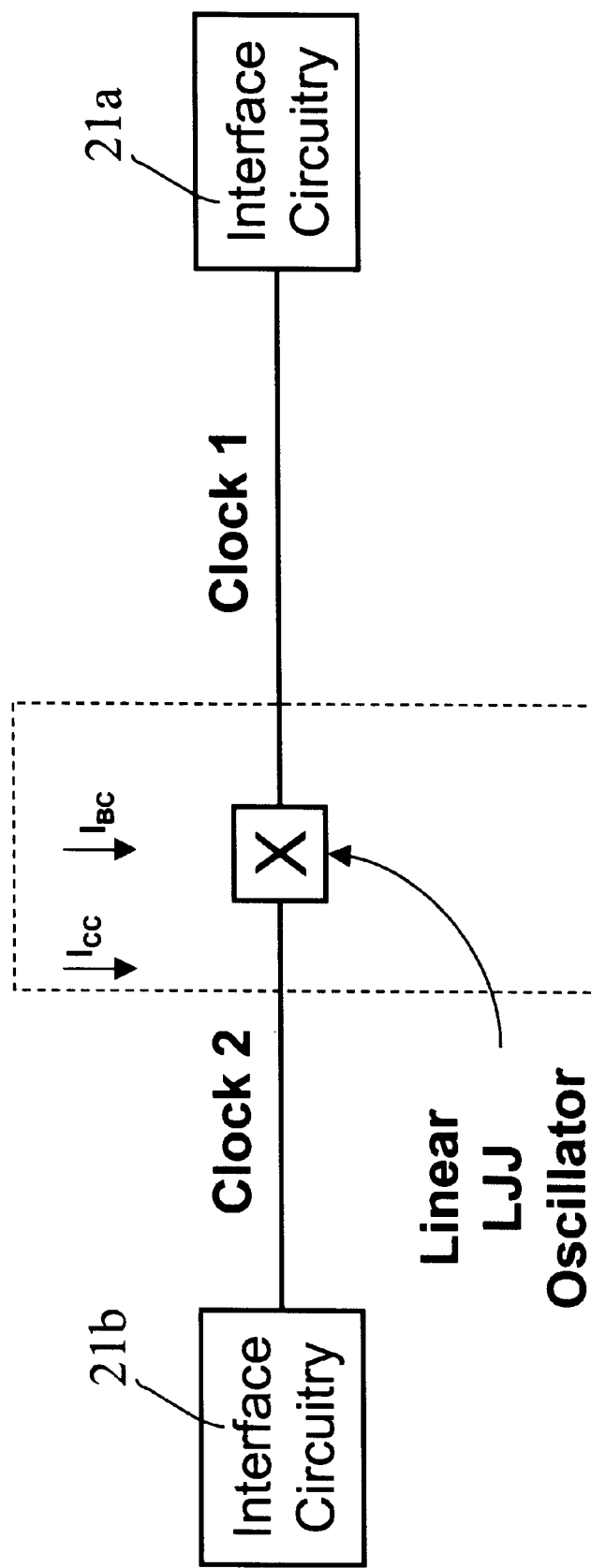
Fig. 3B2

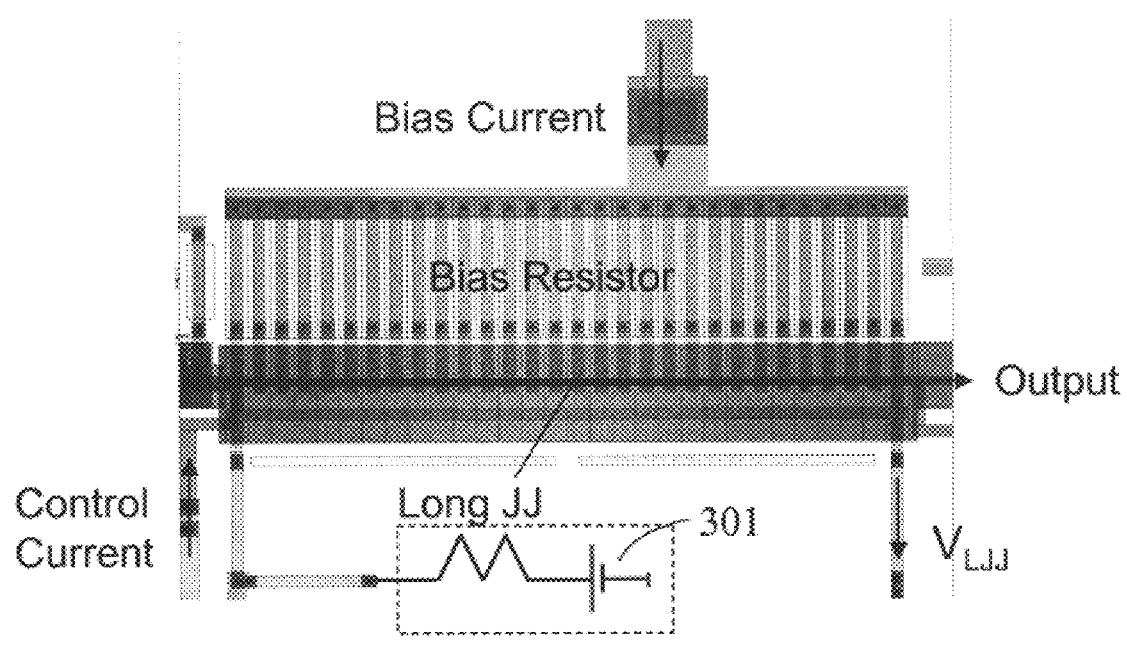
Fig. 3C1

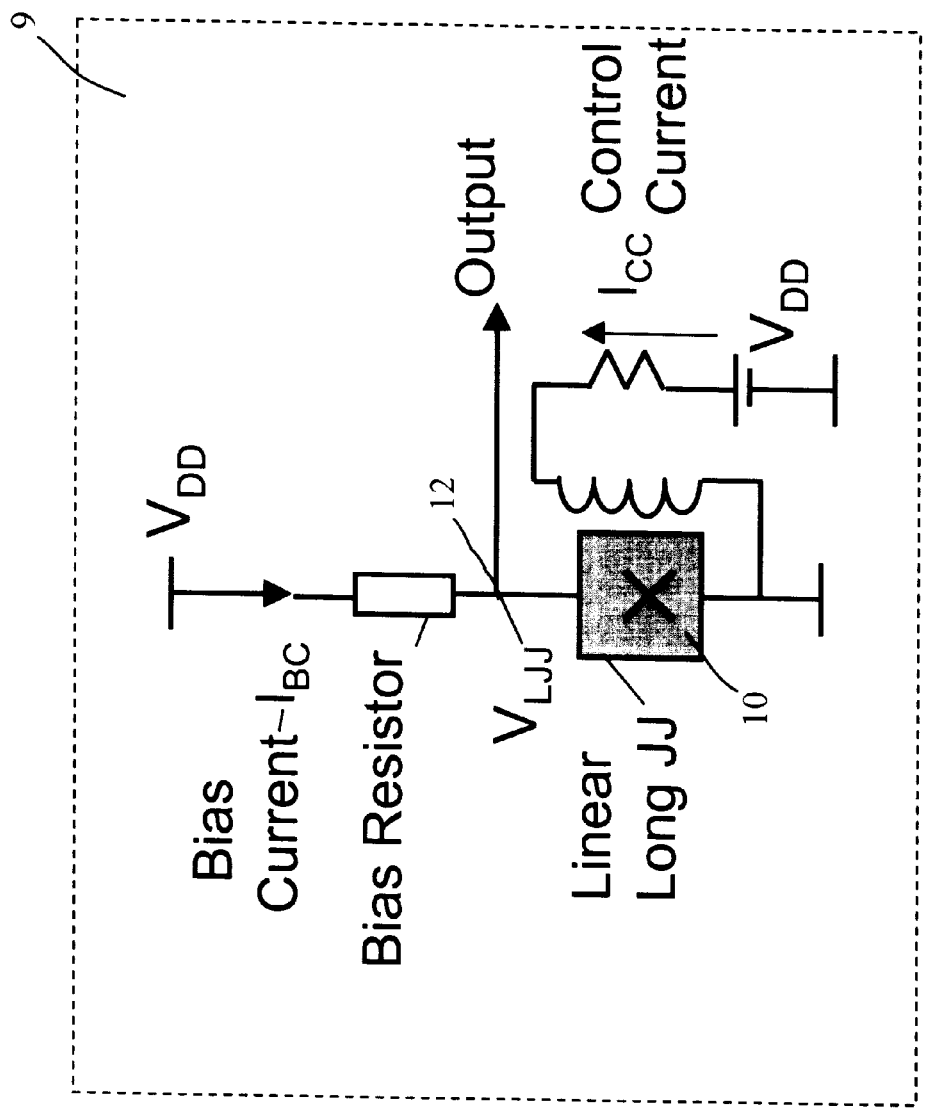
Fig. 3C2

Time period of $f_0/256$ output = 4.52 ns   Frequency of $f_0/256$ output = 221 MHz $f_0 = 56.6$ GHz

ON-CHIP LONG JOSEPHSON JUNCTION (LJJ) CLOCK TECHNOLOGY

This application claims the benefit of U.S. Provisional Application No. 60/174,694 filed Jan. 6, 2000.

BACKGROUND OF THE INVENTION

This invention relates to on-chip clock circuits made with long Josephson junction (LJJ) technology and to clock signal distribution schemes which allow integration with rapid-single-flux-quantum (RSFQ) digital circuits and including circuits such as analog-to-digital converters realized in (RSFQ) technology.

A need exists for, on-chip, high-frequency low jitter oscillators and clock circuits which are suitable for numerous different signal processing applications.

SUMMARY OF THE INVENTION

One aspect of the invention is directed to on-chip high-frequency, low-jitter clock circuits including long Josephson junction (LJJ) oscillators usable as clock sources. The on-chip clock circuit may include a clock selector circuit and a clock distribution scheme and may be integrated with RSFQ circuits and/or with a wideband analog-to-digital converter (ADC) comparator. LJJ oscillators embodying the invention may be formed using either "linear" or "annular" long Josephson junctions. This invention enables the generation and distribution of a stable high-frequency on-chip single flux quantum (SFQ) clock. This will enable the design of a simpler and cheaper instrument prototype. Applicants' on-chip clocking scheme may have an extensive impact on all future superconducting electronic systems.

The invention also includes a new fluxon "sender" circuit suitable for synchronizing the LJJ oscillator with another oscillator, either on-chip or external to the chip. The new sender circuit may also enable the realization of a novel phase-locked loop (PLL) circuit.

In accordance with the invention, an on-chip, multi-GHz, single flux quantum (SFQ) master clock source using a long Josephson junction (LJJ) oscillator may be used to clock rapid-single-flux-quantum (RSFQ) circuits. Coupling a multi-GHz LJJ master clock coupled to an RSFQ clock decimator (e.g., a frequency divider) permits the production of clock frequencies ranging from the low GHz range to 100 or more GHz.

The invention also includes a clock selector circuit to enable transmission of SFQ clock pulses on impedance-matched striplines. The clock selector allows a user to choose between a master clock and its binary subharmonics and improves the range of operation (including the testability) of clocked digital circuits and/or analog-to-digital converter (ADC) circuitry. Although Josephson transmission lines (JTLs) are commonly used to distribute clock pulses in RSFQ circuits, they are generally unsuitable for clock distribution in the Flash ADC architecture because of the delays they introduce. To overcome this problem, applicants developed a ballistic transport of SFQ pulses on stripline transmission lines. Hybrid JTL/stripline structures that are essential for the proposed clock distribution scheme were designed and characterized. The invention may include a chip with a wideband ADC clocked with an LJJ oscillator and clock selector circuitry. A clock distribution scheme embodying the invention includes the measurement of the delay and additional jitter introduced by a JTL network. It also includes the design of a passive transmission structure using matched, low-impedance microstrip lines. It also includes the design of a hybrid transmission structure with JTLs used only for splitting the clock and microstrip lines for long-distance transmission.

Oscillators (see FIGS. 6, 6A and 6B) made with an annular long junction in accordance with the invention have some significant advantages. The annular junction has no boundary effects and may be operated to generate only one SFQ pulse per cycle. In the linear LJJ, every time a trapped fluxon hits a boundary, it reverses direction and travels to the other boundary as an antifluxon. This corresponds to a phase change of $4\pi$ and two SFQ pulses are emitted in each cycle. An annular junction is generally easier to bias and more stable than a linear junction. To use the circulating fluxon(s) in the annular junction as clock pulses, a JTL may be weakly coupled to the LJJ resonator. Resonant soliton (fluxon) oscillations in a linear LJJ may be triggered by injecting an SFQ pulse from one end. A soliton is an electromagnetic pulse that maintains its shape while propagating. A fluxon (or a quantum of magnetic flux, $\Phi_0 = h/2e$) in a long junction travelling back and forth between the two ends along the long dimension of the junction has the properties of a soliton. The term "soliton" and "fluxon" are used interchangeably, although "soliton" is more particularly used to denote a fluxon in a long Josephson junction (LJJ)

BRIEF DESCRIPTION OF THE DRAWINGS

FIGS. 3A1, 3A2, 3B1, 3B2, 3C1 and 3C2 relate to a linear LJJ and its use in an oscillator circuit;

DETAILED DESCRIPTION OF THE INVENTION

Linear Long Josephson Junction Oscillator Coupled to RSFQ Clock Decimator

Figure 3A:
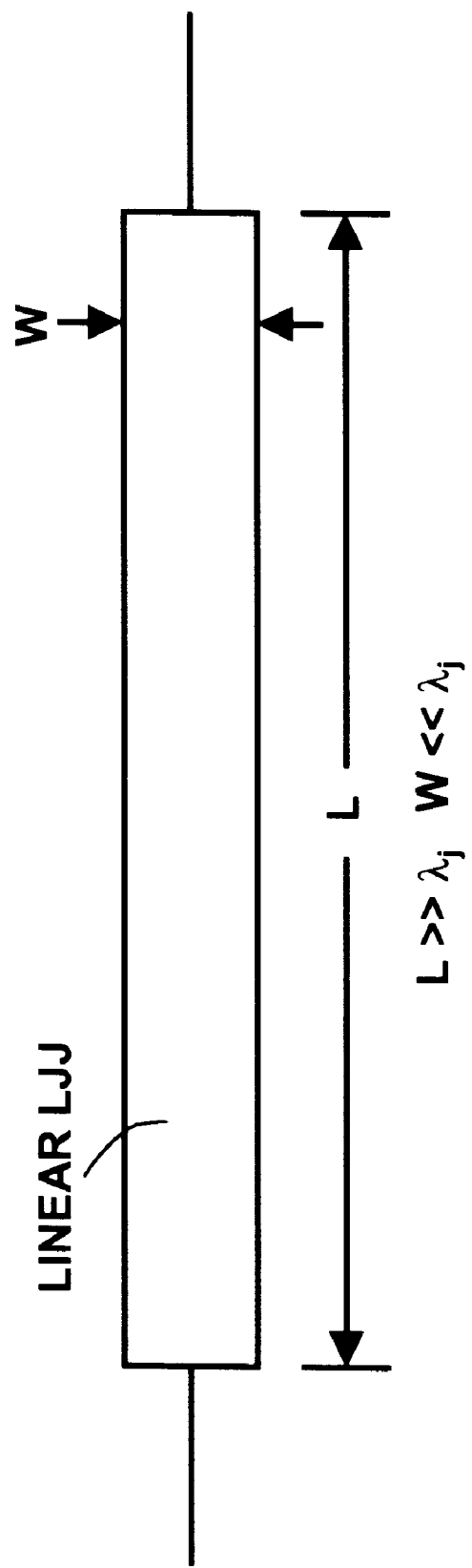
FIG. 3(a) shows the structure defining a linear LJJ.
Figure 3B:
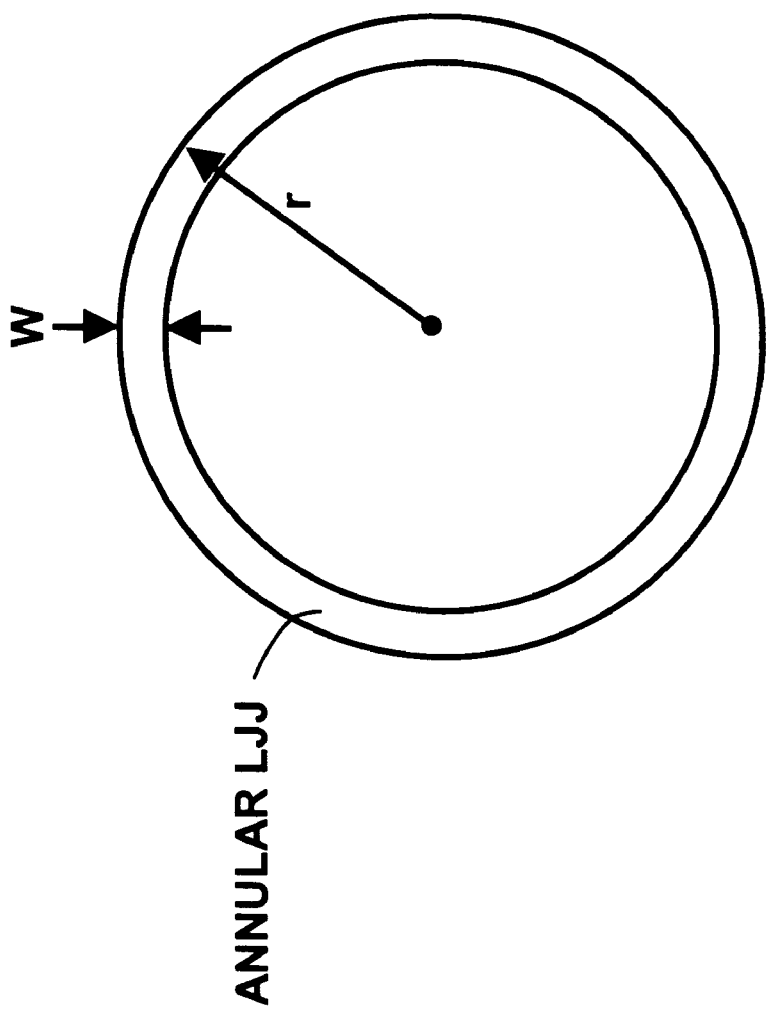
FIG. 3(b) shows the structure defining an annular LJJ.

In the specification and in the claims appended hereto, a long Josephson junction (LJJ) refers to a two-dimensional geometry component which, as shown in FIGS. 3(a) and 3(b), along one dimension, is much larger than the Josephson penetration depth ($\lambda_J$) and, in the other dimension, is much smaller than $\lambda_J$. In contrast, a small Josephson junction (SJJ) is smaller than $\lambda_J$ in both dimensions.

According to one aspect of Applicants' invention, a linear or an annular LJJ may be used to form oscillator circuits exhibiting low jitter and suitable to be formed on-chip. For a linear LJJ, in a zero or relatively weak external magnetic field present in, or applied to, the LJJ, a soliton (or fluxon) propagating in one direction reverses direction upon hitting an end of a linear LJJ. For the linear LJJ, the soliton propagating in the reverse direction is usually referred to as an antisoliton. The quantum mechanical phase change at the junction boundary is $4\pi$. This process is repeated resulting in the resonant (back and forth propagation) soliton mode. Note that, in an annular LJJ, there is no reversal since there are no boundaries. Note also that a fluxon does not propagate in an SJJ because the junction is smaller than $\lambda_J$.

A high-frequency oscillator can be realized using the resonant soliton mode. The reason is that a soliton—an electromagnetic pulse—impinging on a junction boundary, gives rise to the emission of pulse(s) of electromagnetic energy. If the arrival of solitons at one end of the junction is periodic, rf radiation is emitted. An oscillator using the resonant soliton mode has a very narrow linewidth and small power. However, it is adequate to clock RSFQ circuits. Since the phase change at the boundary is $4\pi$, two SFQ pulses are generated in a Josephson transmission line (JTL) connected at a linear LJJ boundary. Note that, in an annular junction, a phase charge of $2\pi$ is produced in a JTL connected to the annular LJJ.

When the applied magnetic field is zero or small, the oscillator frequency in the resonant mode is determined primarily by the junction length (L) rather than the applied field and dc bias current. This suggests a rather well defined frequency. The resulting resonant step in the I–V characteristic is commonly called a zero field step (ZFS). When the linear LJJ is biased on a zero field step, the emitted radiation is characterized by a very narrow output linewidth. The resonant soliton oscillator frequency is given by the modified Josephson relation $$f_n = V_n/2\Phi_0 = n\bar{c}/2L, \quad (1)$$

where $\bar{c}$ is the average fluxon velocity in the LJJ, and n is the number of fluxons (or antifluxons) moving in the junction of length L. Since two SFQ pulses are generated in each cycle the pulse rate at the output of the linear LJJ is $2f_n$.

Figure 1A:
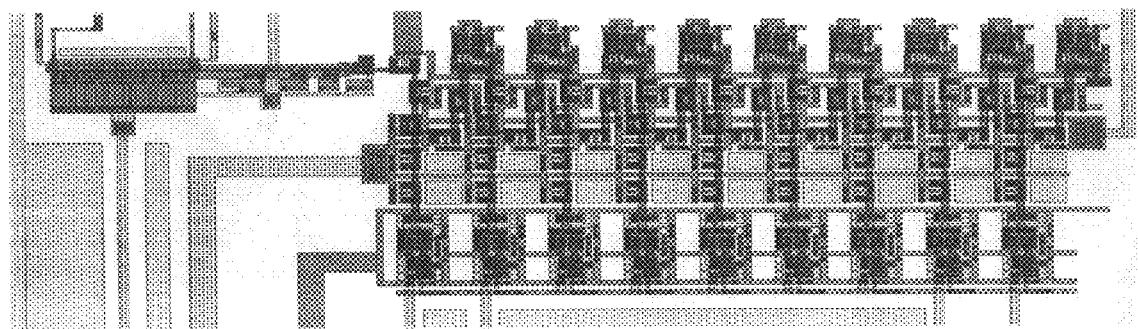
FIG. 1A is a layout of an LJJ oscillator embodying the invention.
Figure 1B:
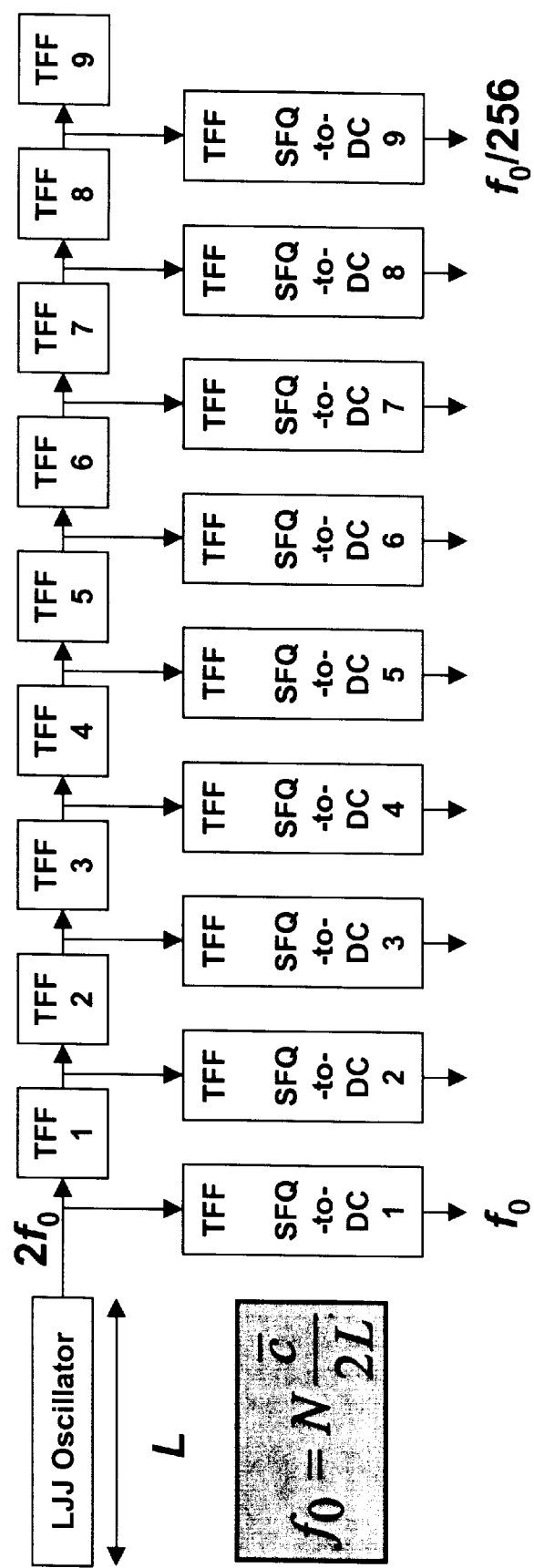
FIG. 1B is a block diagram of the layout of FIG. 1A.

FIGS. 1A and 1B show a linear LJJ oscillator coupled to an RSFQ clock decimator (i.e., binary frequency divider) circuit, which consists of toggle flip-flop (TFF) stages, each dividing the clock frequency by a factor of 2. In each cycle, the LJJ emits two SFQ pulses, so the pulse rate is twice the resonant frequency ($f_0$). The physical layout of a linear LJJ oscillator and its associated interface and buffer circuitry is shown in FIG. 3A1 and its corresponding schematic diagram is shown in FIG. 3A2. The physical layout of the linear LJJ is shown in greater detail in FIG. 3C1 and its corresponding schematic diagram is shown in FIG. 3C2.

Figure 2A:
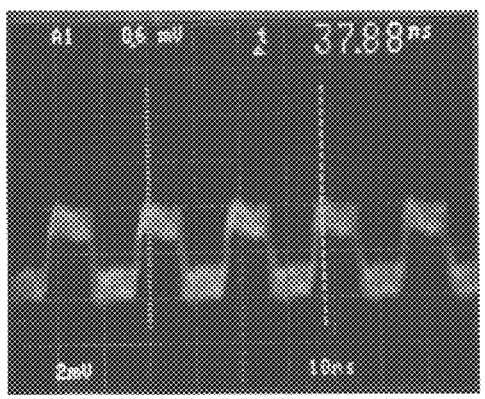
FIGS. 2 (a) and (b) are waveform diagrams of LJJ oscillators.
Figure 2B:
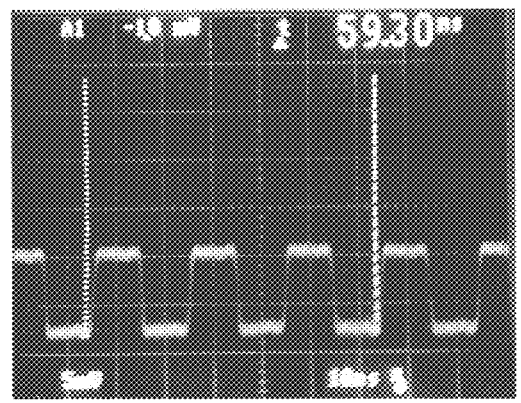
Figure 3C:
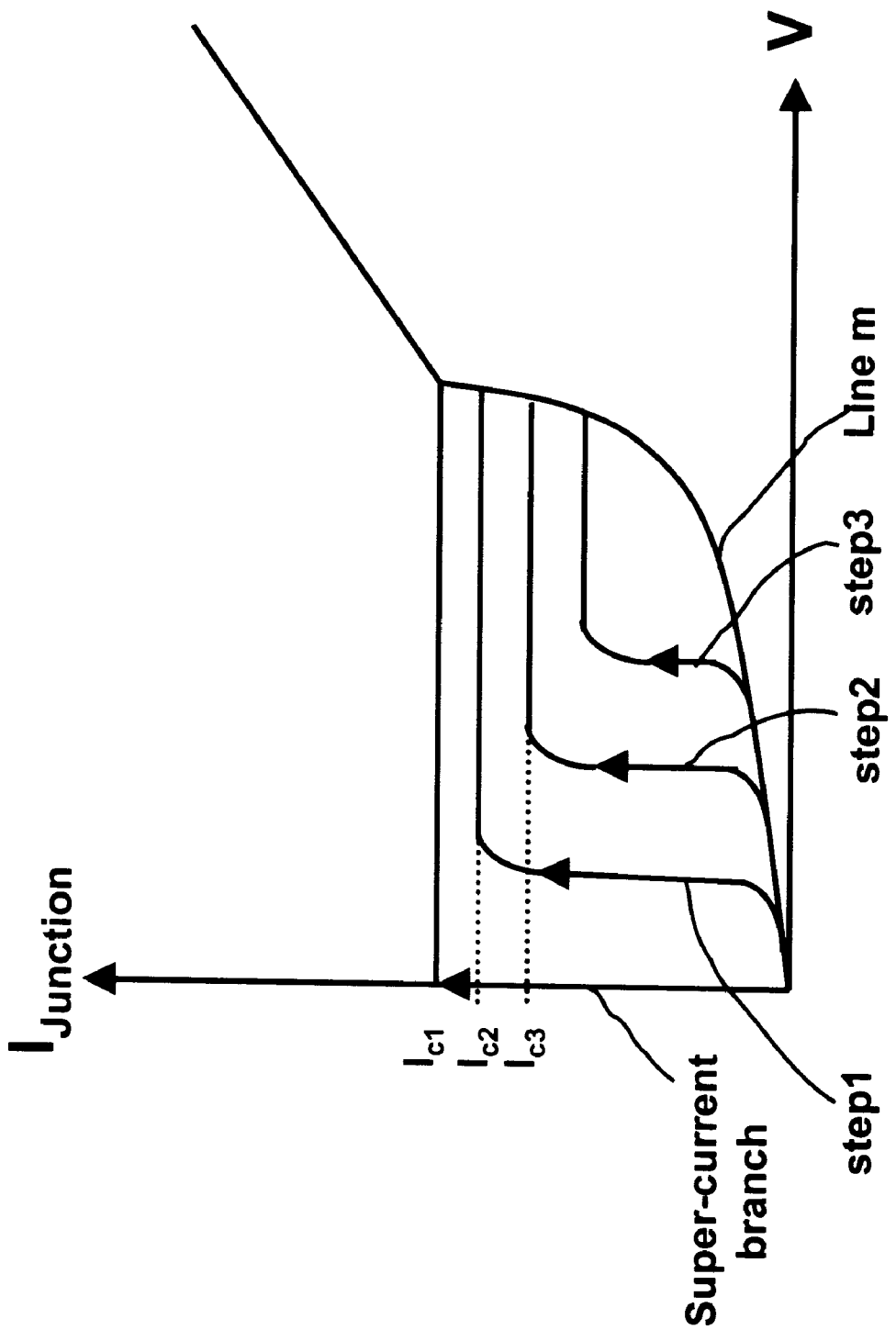
FIG. 3(c) shows an I–V characteristic of an unshunted, i.e.,undamped, Josephson junction.

The linear LJJ oscillator 9 shown in FIG. 3C2 includes a linear long Josephson junction 10. As shown in FIG. 3(a), the linear LJJ 10 has a two dimensional geometry and is formed such that the Josephson penetration depth in one dimension (e.g., the width) is much smaller than the Josephson penetration depth $\lambda_J$, while in the other dimension(e.g., the length), it is much larger than $\lambda_J$. The linear LJJ 10 is connected between an output node 12, at which is produced the oscillatory signals and a point of reference potential (e.g., ground). A direct current (d.c.) bias current, $I_{BC}$ is conductively (i.e., ohmically) supplied via a bias resistor to linear LJJ 10 at node 12. A d.c. control current $I_{CC}$ is generated and is magnetically coupled to the linear LJJ 10. The magnetic coupling is achieved by means of an inductive wire overlying LJJ 10 through which the $I_{CC}$ flows. The bias current functions to induce the generation of fluxons within LJJ 10. The bias current may be varied. Reducing the bias current to zero returns the LJJ to the zero-voltage state. Once oscillations are underway, reducing the bias current causes the frequency to decrease slightly as long as operation of the Josephson junction is maintained in the step. As shown in FIG. 3(c), the I–V curve of an unshunted Josephson junction is hysteretic. If bias current is increased from zero, there is no voltage across the junction if it is below the critical current ($I_C$); i.e., the device is in its "superconductive" state. If the bias current exceeds $I_C$, it goes or switches to the "normal" (i.e., resistive) state. If the bias current is reduced, it follows the descending part of the I–V curve and returns to zero along the shallow line (line M in FIG. 3c). If the bias is increased again before it reaches zero, the current increases along one of the zero-field steps (e.g., steps 1, 2 etc.) before it switches out to the normal state again. The control current, $I_{CC}$, functions to produce a magnetic field which causes introduction of magnetic flux quanta into the junction. The amplitude of $I_{CC}$ may be varied to change the number of fluxons trapped in the junction.

FIG. 3A1 shows the layout and FIG. 3A2 shows the corresponding block diagram of interface circuitry used to couple the LJJ oscillator to any load (RSFQ circuit to be checked) such as the decimator circuitry. As shown in FIG. 3A2, the LJJ oscillator circuit 10 is coupled to the input of an interface circuit 21 whose output is coupled to a buffer circuit 23. Buffer circuit 23 includes a diode-like function, 23(a), to permit only unidirectional current flow and a buffer 23(b) whose output is then suitable to drive loads such as the divider network shown in FIGS. 1A and 1B. For example, in FIG. 3A1 and 3A2, the interface circuit 21 includes 3 stages, it should be noted that inductor L2 is made smaller than inductor L1 and inductor L3 is made smaller than inductor L2. That is, the inductors are made progressively smaller the further away they are from the LJJ. At the same time, the resistively shunted Josephson junctions (J1, J2, J3) are made progressively larger. This reduces the loading on the oscillator circuit while enabling more drive for the load circuit.

Note that, in addition to, or instead of, the control circuit magnetically coupled to the LJJ, a direct current can also be injected at one end of the LJJ, as shown by 301 in FIG. 3C1.

FIG. 3B1 shows that a linear LJJ has two boundaries. Fluxons bounce back and forth between the two boundaries, which are used to produce two clock streams which are 180 degrees out of phase. Signals may be obtained from either boundary. FIGS. 3B1 and 3B2 illustrate that a two-phase single flux quantum (SFQ) clock source can be realized by connecting both ends of a linear LJJ to appropriate interface circuits. The two clock streams are exactly 180 degrees out of phase. In many RFSQ digital circuit applications, two such alternating clock streams are needed. At high clock frequencies (e.g., 10–100 GHz) it is difficult to maintain exact phase difference of two such alternating clock streams. However, the inherent resonant nature of the LJJ oscillator ensures low phase (and phase difference) noise for the two clock streams.

The clock decimator consists of 8 toggle flip-flop (TFF) stages; each stage divides its input pulse rate by a factor of two. The output of each TFF stage is fed to the next TFF stage and is simultaneously applied to an SFQ/DC converter stage. Each SFQ/DC converter stage includes a TFF and produces a voltage waveform. Each SFQ pulse corresponds to a toggle between a high (300 microvolts) and a low (0 microvolts) value in this voltage waveform.

FIGS. 2(a) and 2(b) show the output of two different linear LJJ oscillators (both 220 $\mu$m long and 3.5 $\mu$m wide) after 9 TFF stages from two different fabrication runs. Both devices were biased on the first ZFS. The difference in frequencies of the two devices is due to different bias conditions. The frequency can be tuned by varying the dc bias of the LJJ. The range of tunability of the device (b) was measured to be 12.48 GHz to 14.44 GHz. FIGS. 2(a) and 2(b) show the digital waveforms of the $f_0/256$ signal; which corresponds to the signal from the $8^{th}$ TFF which is fed to SFQ/DC9 (see FIG. 1). Since the SFQ/DC converter adds another TFF, the frequency of this waveform corresponds to 2 times $f_0/2^9$ or $f_0/256$, where $f_0$ is the resonant frequency. The two waveforms shown in the figures correspond to the same measurement done on LJJs fabricated in two different fabrication runs.

Figure 5:
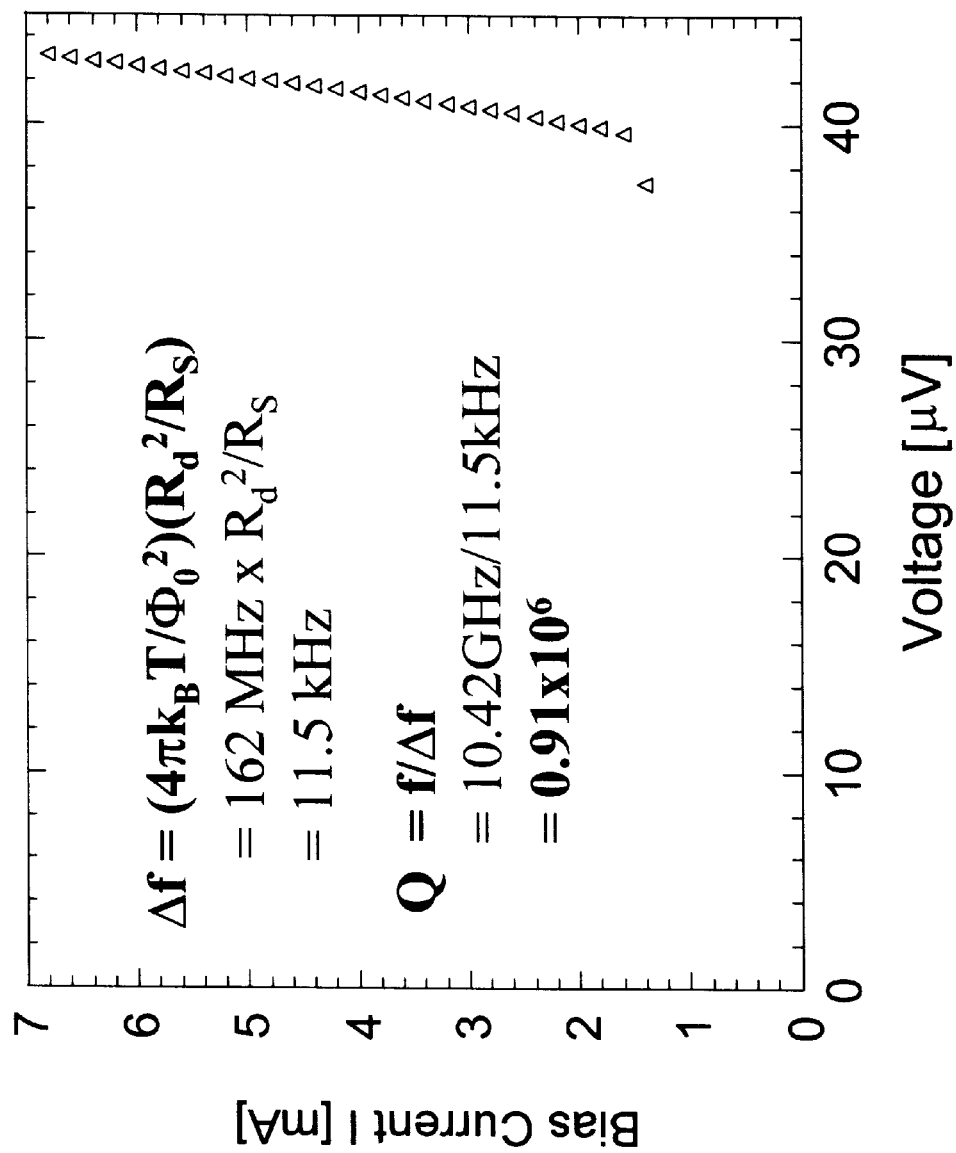
FIG. 5 is an I–V curve of linear LJJ.

The bias current applied to the LJJ, see FIGS. 3A2 and 3C2, may be varied (controlled) to tune or change the oscillator frequency. This enables the LJJ to be biased on different zero field steps. The frequency of the oscillator can be tuned (changed) by varying the current bias on a step of the LJJ, as shown in FIGS. 3(c), 3D and 5.

Figure 3D:
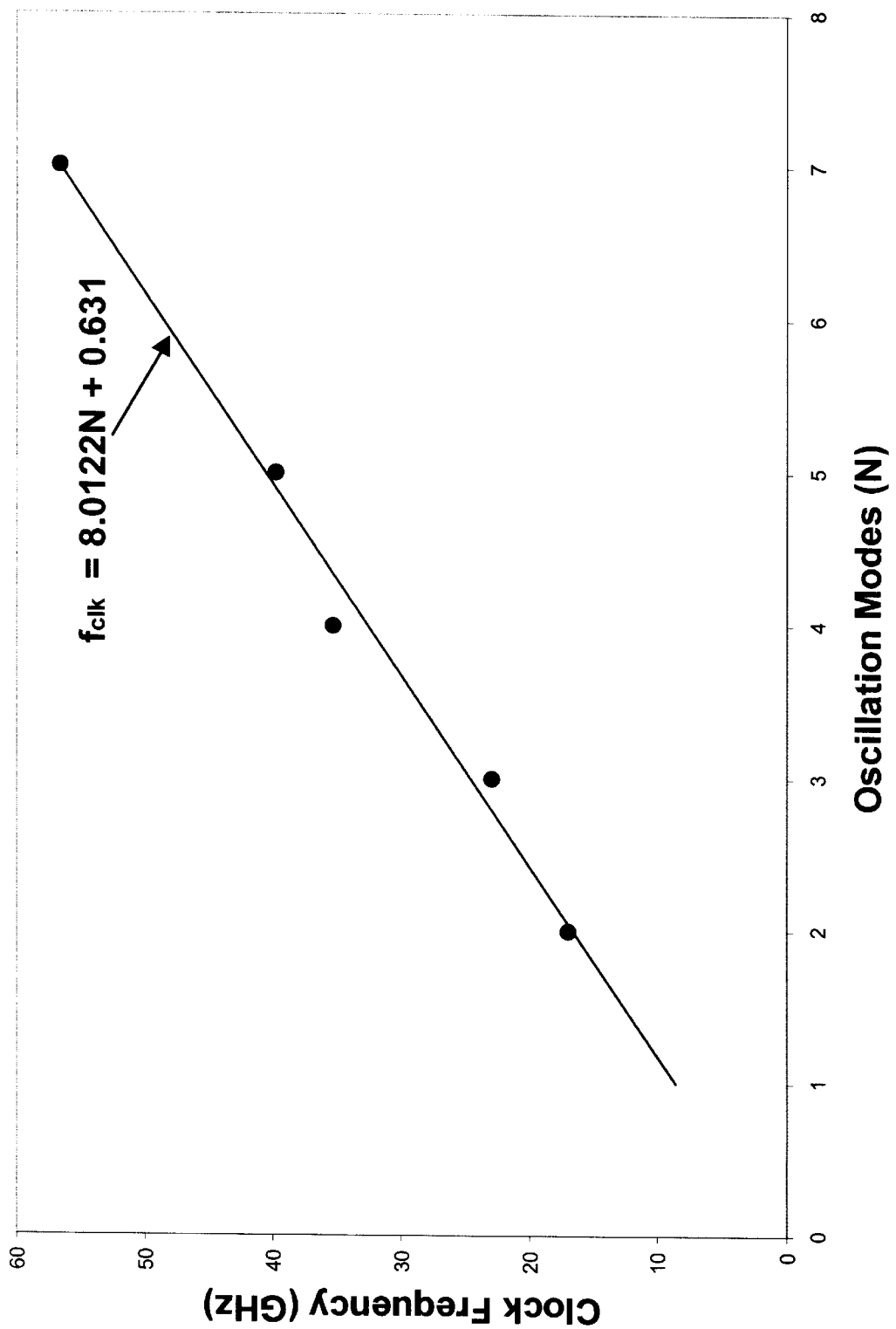
FIG. 3D is a plot of frequencies which may be generated with an LJJ oscillator.

FIG. 3D shows the frequencies generated from a 440 $\mu$m×3.5 $\mu$m linear LJJ oscillator corresponding to different zero field steps (ZFS). The Nth oscillation mode corresponds to the Nth ZFS. N is the number of fluxons in the oscillator. FIG. 3D shows the different frequencies generated by biasing a linear LJJ oscillator to different steps. The frequencies fall on a straight line in agreement with the theory.

Figure 4A:
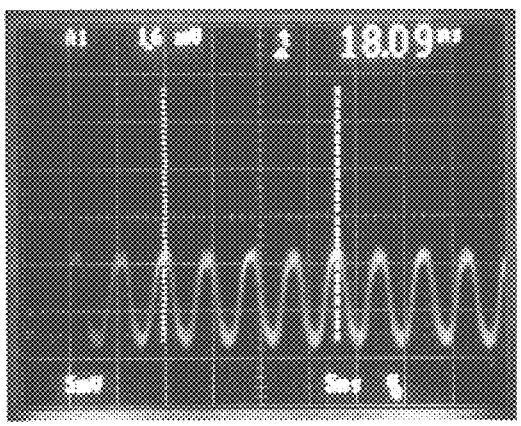
FIGS. 4(a) and (b) are waveforms and the spectrum of an LJJ oscillator.
Figure 4B:
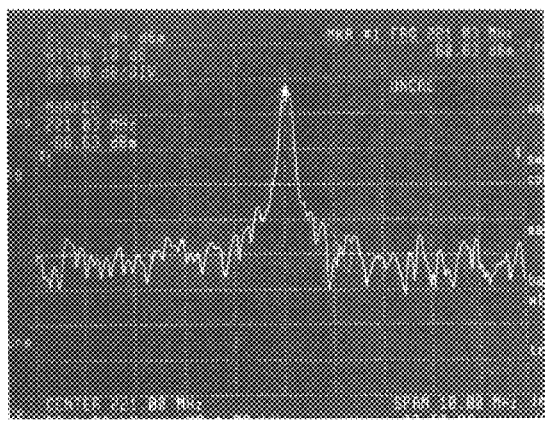

FIGS. 4(a) and 4(b) show the waveform and the spectrum of a 440 $\mu$m×3.5 $\mu$m linear LJJ oscillator after 9 TFF stages. The LJJ is biased on the $7^{th}$ ZFS. The LJJ oscillator frequency is measured with a spectrum analyzer at the $9^{th}$ TFF output ($f_0/256$). The spectral measurement corresponds well with the waveform measurement.

From the spectrum, the dc I–V curve (FIG. 5) can be accurately reconstructed using equation (1). Applicants calculated the linewidth ($\Delta f=(4\pi k_B T/\Phi_0^2)R_D^2/R_S$, where $R_D=dV/dI_b$ and $R_S=V(I_b)/I_b$) and quality factor ($Q=f/\Delta f$; where f is the resonant frequency). The Q of an oscillator of the type shown in FIGS. 3A1 and 3A2 was calculated from the spectral measurement to be $9.1\times10^5$. The linewidth of 11.5 kHz at a center frequency of 10.42 GHz translates to an estimated jitter ($\tau_{jitter}=\Delta f/f^2$) of approximately 0.1 femtoseconds (fs).

Annular Long Josephson Junction Oscillator Coupled to RSFQ Clock Decimator

Figure 6:
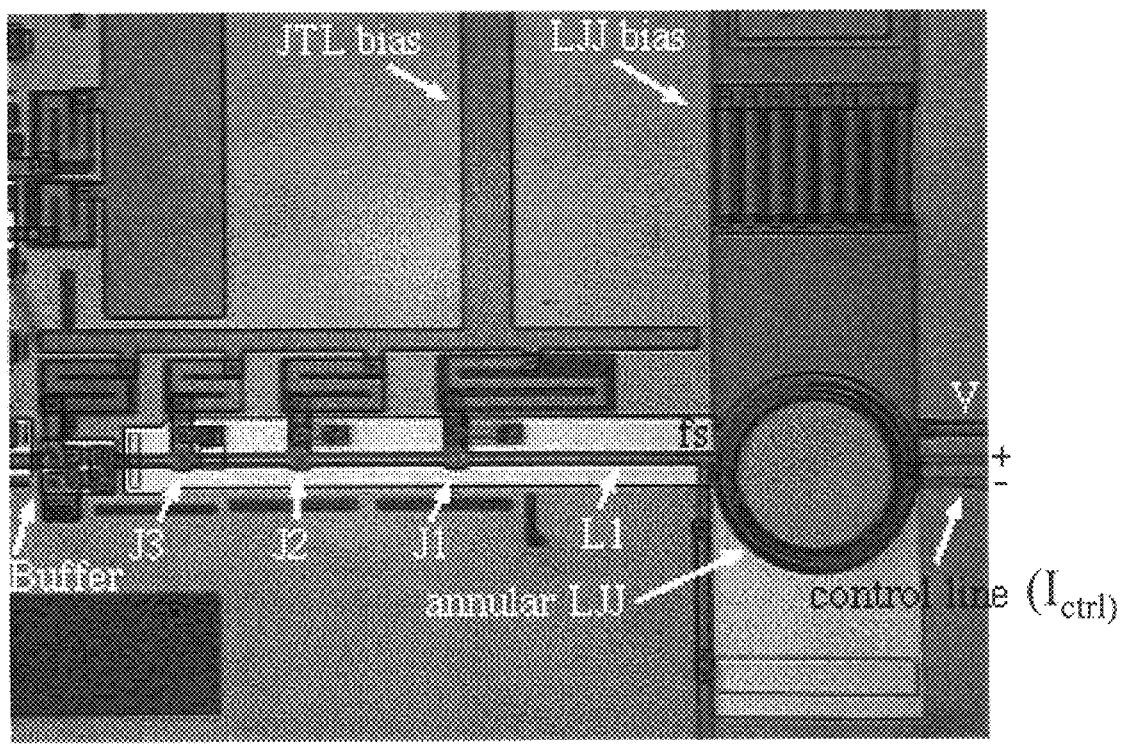
FIG. 6 is a layout of an annular LJJ oscillator circuit.
Figure 6A:
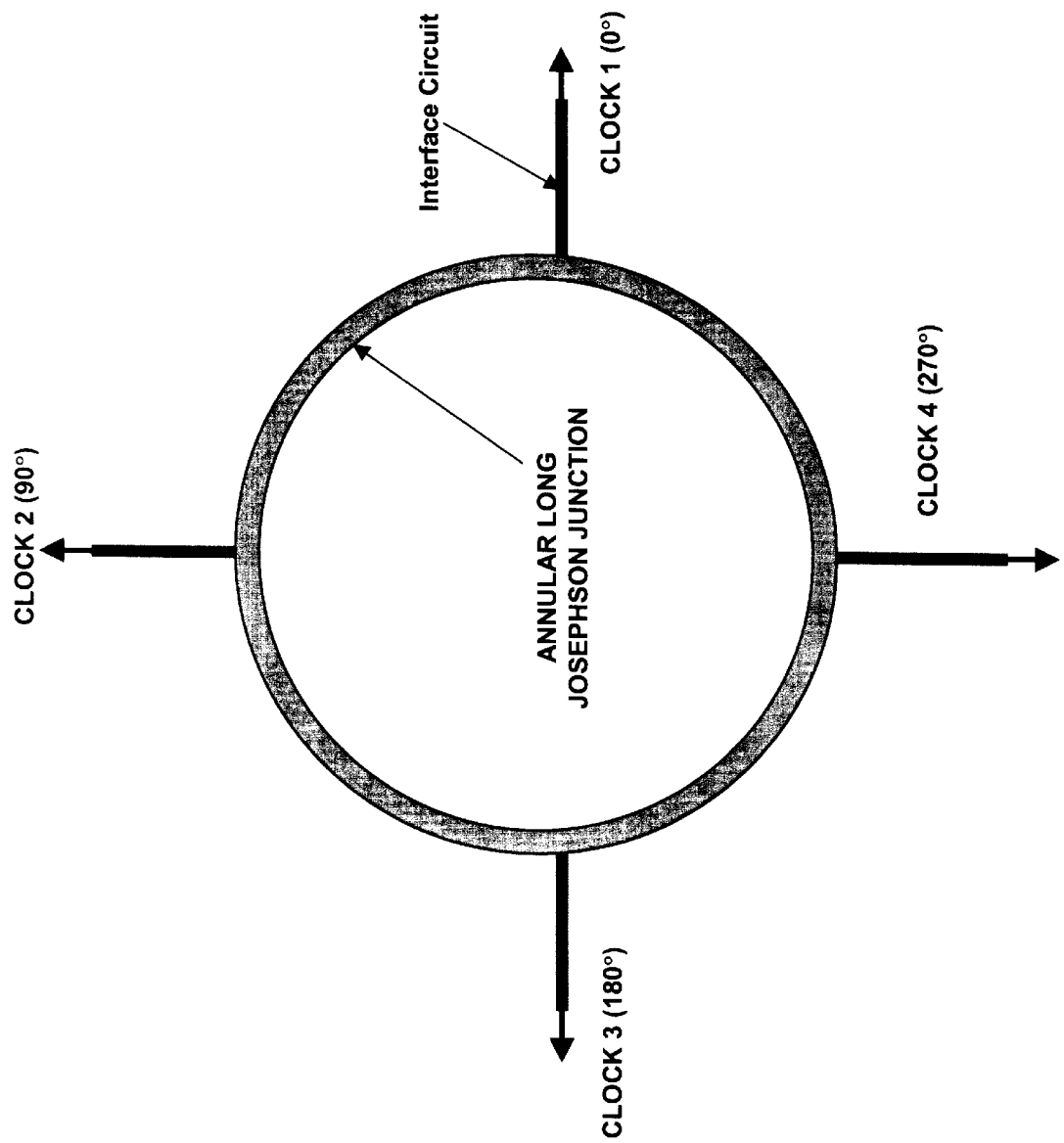
FIGS. 6A, 6B, 6C and 6D are diagrams of an annular LJJ and its use in oscillator circuitry.

FIG. 6 is a layout of an annular LJJ oscillator circuit coupled to interface circuitry for driving a load such as an RSFQ clock decimator(e.g., a frequency divider). FIG. 6A is a schematic representation of an annular LJJ which may be used to form an annular LJJ oscillator. FIG. 6A illustrates that a multiphase single flux quantum (SFQ) clock source can be realized by forming output taps along the annular ring. These taps may be formed around the annular junction at every 90 degrees (0°, 90°, 180° and 270°). Appropriate interface circuits are connected to each tap along the annular LJJ oscillator. Attention has to be paid to the design of the interface circuits since each interface circuit presents an inductive load which degrades the quality of the oscillator. FIG. 6A is an example of a four phase clock source where the phase differences are 90 degrees. The phase differences around the ring do not have to be uniform and almost any combination of phase differences between clock streams can be achieved by appropriate connection of the interface circuits.

Figure 6B:
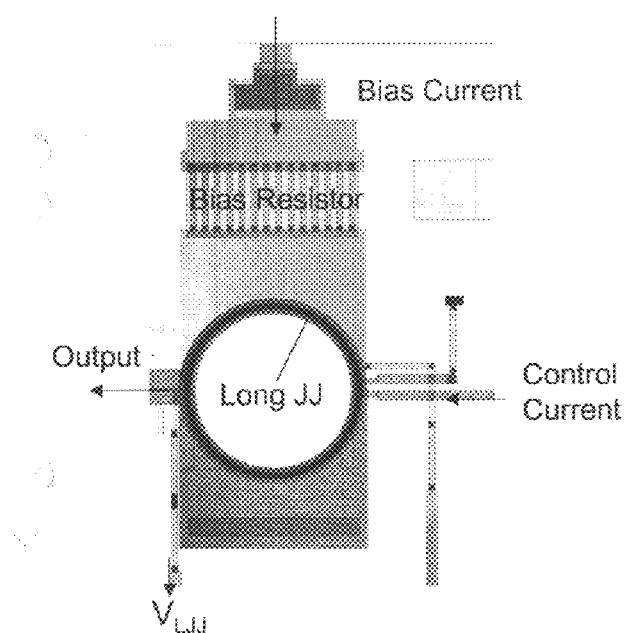
Figure 6C:
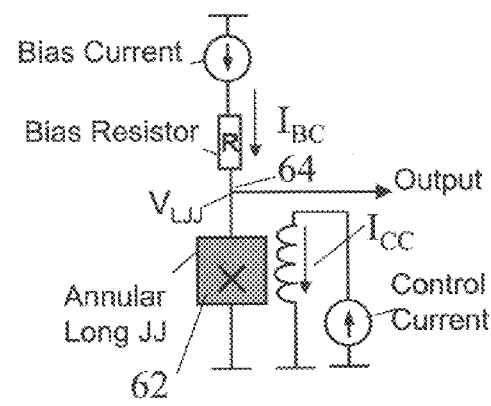

FIG. 6B is a layout of an annular LJJ oscillator circuit 60 and FIG. 6C is a schematic representation of the layout of FIG. 6B. The annular LJJ oscillator 60 shown in FIGS. 6B and 6C includes an annular long Josephson junction 62. As shown in FIG. 3(c), the annular LJJ, like the linear LJJ, has a two dimensional geometry and is formed such that in one dimension (e.g., the width of the annular ring) it is much smaller than the Josephson penetration depth $\lambda_j$, while in the other dimension (along the circumference), it is much larger than the Josephson penetration depth $\lambda_j$. The annular LJJ 62 is connected between an output node 64, at which is produced the oscillatory signals and a point of reference potential (e.g., ground). A direct current (d.c.) bias current, $I_{BC}$ is conductively (i.e., ohmically) supplied via a bias resistor to LJJ 62 at node 64. A d.c. control current $I_{CC}$ is generated and is magnetically coupled to the linear LJJ 62. The magnetic coupling is achieved by means of an inductive wire physically overlying LJJ 62, through which the $I_{CC}$ flows. The bias current functions to induce the generation of fluxons within LJJ 62. The bias current may be varied. Increasing the bias current of the annular junction may cause switching from odd series to even series steps. In other respects, the operation of the annular LJJ is similar to the linear LJJ.

Thus, an oscillator can be formed using an annular or ring-shaped geometry producing an annular LJJ, as well as with a linear LJJ. But, the annular LJJ, not only eliminates boundary effects, it also, makes it possible to trap a single soliton (fluxon) due to flux quantization. The trapped soliton (s) can move under an infinitely small bias current. A superconducting control line is designed to extend above the LJJ. A dc current, $I_{CL}$, may be supplied to the superconducting control-line to create a magnetic field in the annular LJJ.

Figure 7:
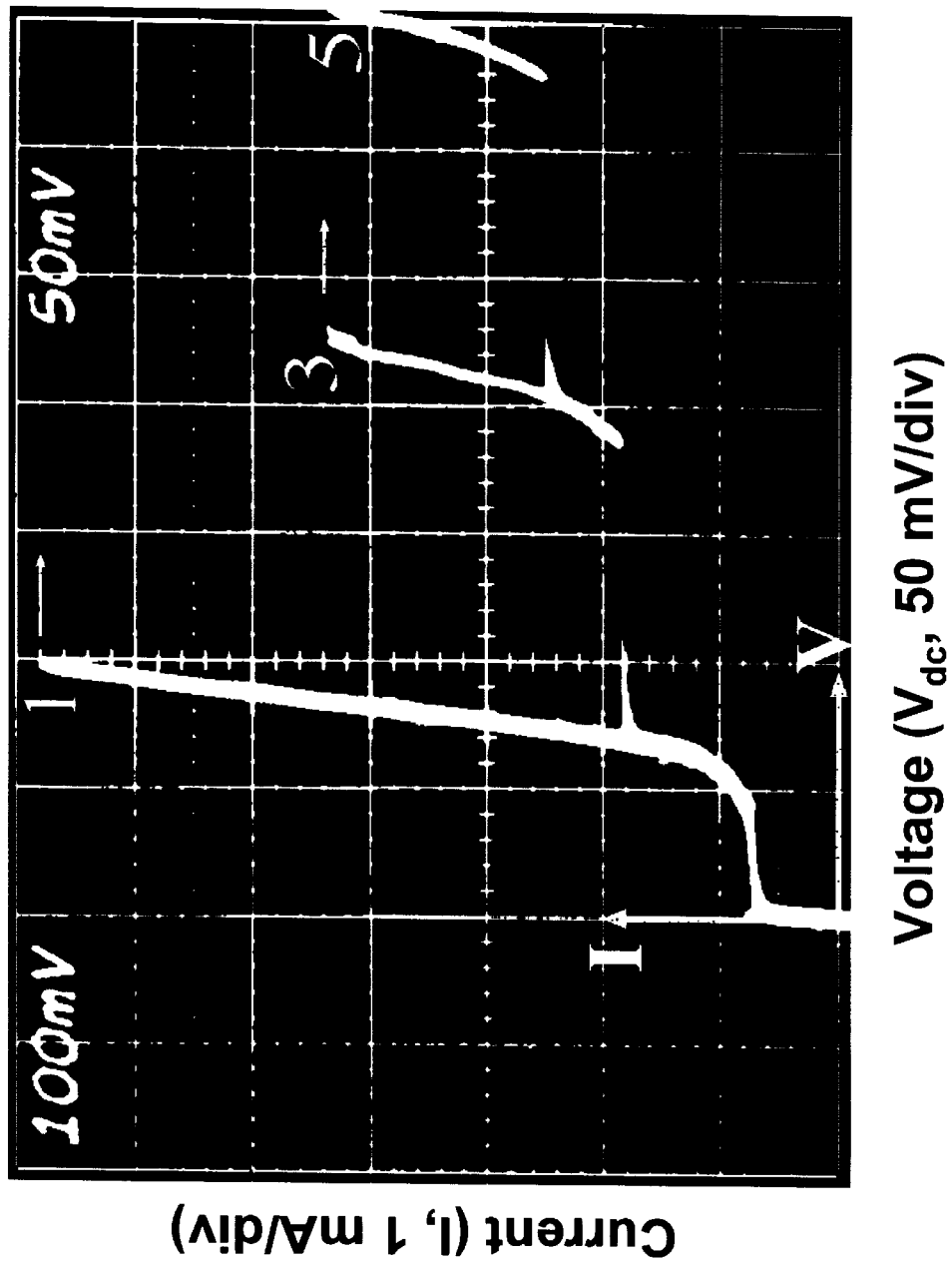
FIG. 7 is an I–V curve of an annular LJJ.

The resonant frequency of the annular LJJ is related to the fluxon propagation velocity $\bar{c}$ by $$f = V_n/\Phi_0 = n\frac{\bar{c}}{L}, \qquad \text{eq. (2)}$$

and the step voltage $V_n=n(\bar{c}/L)\Phi_0$;
where n is the total number of fluxons (and antifluxons) and L is the length ($2\pi$-circumference) of the junction. For the annular LJJ, n satisfies the relation $n=n_0+2i$, where $i=0, 1, 2, \ldots$, and $n_0$ is the number of fluxons initially trapped. With no trapped fluxon ($n_0=0$), the even series of voltage steps is observed and the supercurrent reaches its maximum (7.0 mA) when there is no applied field ($I_{CL}=I_{CC}=0$) With one trapped soliton $n_0=1$, the odd series of the voltage steps ($n=1, 3, 5, \ldots$) is observed (FIG. 7). The odd series is associated with a very small (0.8 mA) supercurrent.

Figure 6D:
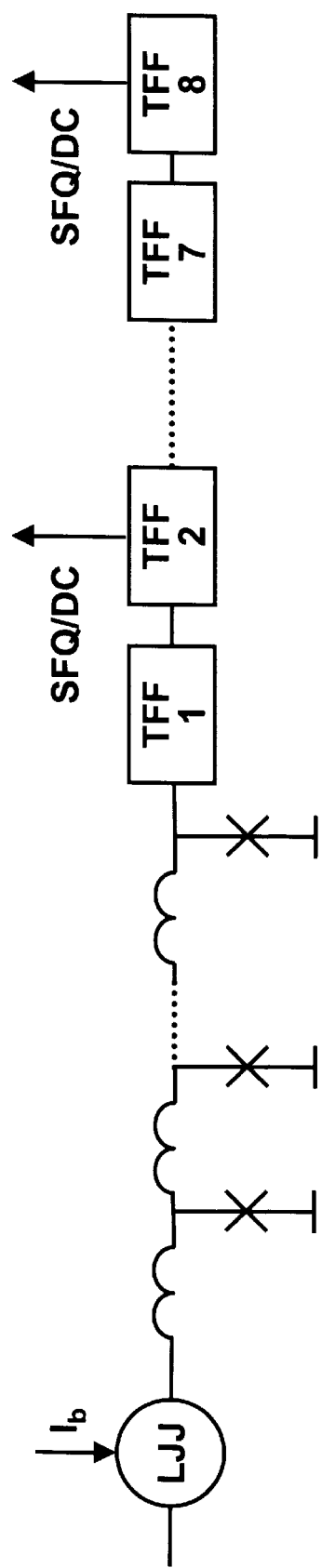

The schematic representation of an annular LJJ/RSFQ circuit are also shown in FIG. 6D. FIG. 6D enables the observation of odd and even series soliton steps on the same LJJ. Note that there was no fluxon trapping during cooling. It was found that the low field (region I), even series, was difficult to bias, while the large field (region II), odd series, was easy to bias.

For application as an on-chip clock, an annular LJJ with one trapped soliton was found to be to be an excellent choice. The small supercurrent makes the annular long Josephson junction oscillator easier to bias than the linear LJJ. Applicants noticed that the first resonant mode (n=1) in FIG. 7 has a bias range from 1 to 7 mA while the bias range of a linear LJJ of the same length is from 3.5 to 5.5 mA. For the linear LJJ, Applicants experienced two problems. First, it was sometimes difficult to bias on the first resonant step. Second, a junction biased on a resonant step may spontaneously switch to the supercurrent (zero voltage) state. Both problems disappear for the annular LJJ with one trapped soliton.

When an annular LJJ oscillator is cooled at zero magnetic field, the even series of steps are produced. An external magnetic field may then be applied using a control current ($I_{CL}$ or $I_{CC}$). The supercurrent ($I_C$) suddenly drops from a constant value (7.2 mA) to a minimum (0.8 mA) when the $I_{CL}$ reaches a certain level (9 mA). At this field, one soliton ($2\pi$-kink) is trapped in the LJJ, the even series disappears and the odd series appears simultaneously.

Figure 8:
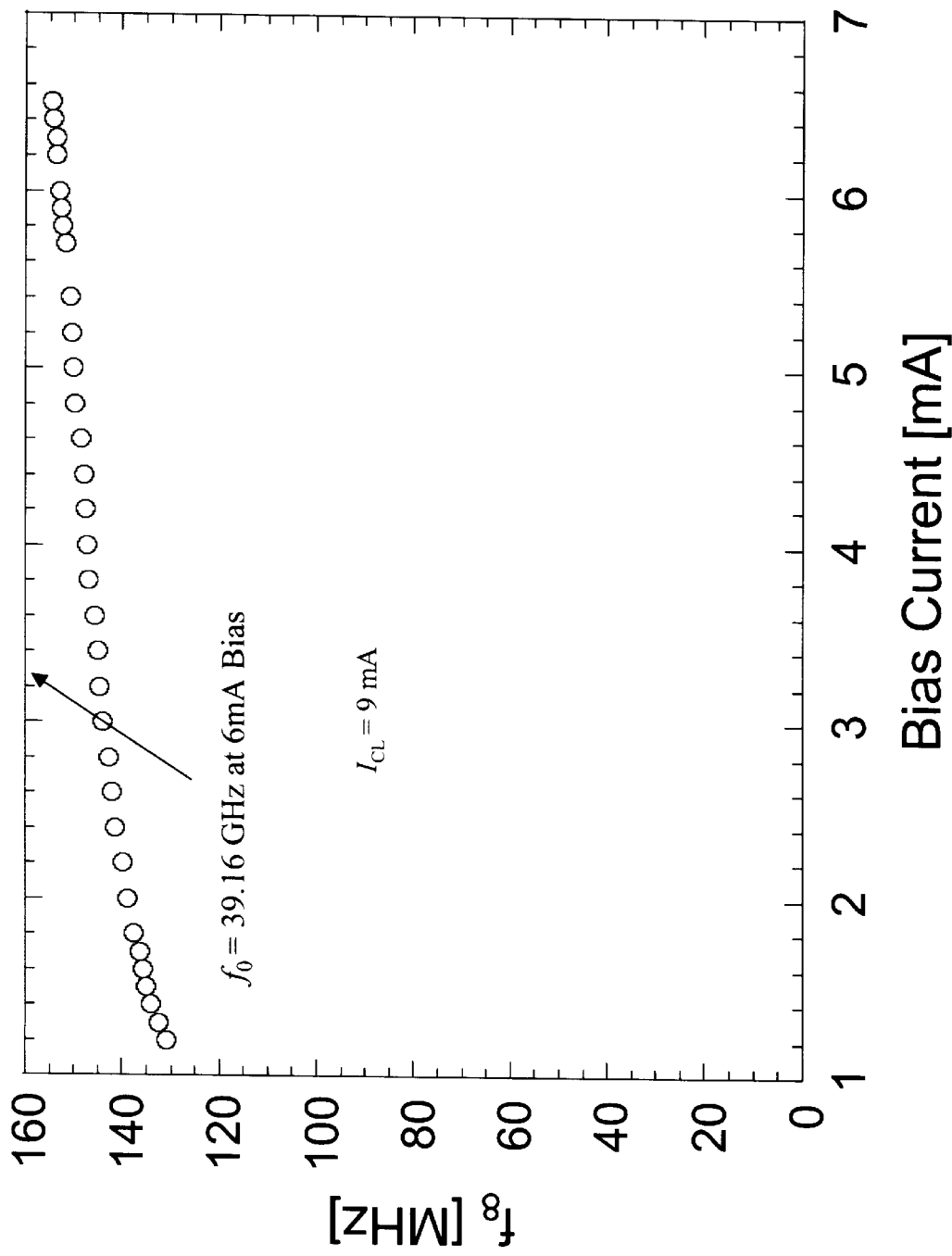
FIG. 8 illustrates the range of tunability of an annular LJJ oscillator.

The annular LJJ was coupled to an RSFQ clock decimator (frequency divider circuit) through a few JTL buffer stages. The first JTL is connected at an interface point on the LJJ (see FIG. 6). When a fluxon in the annular LJJ passes this interface point, an SFQ pulse is generated in the first JTL junction (J1). As noted above, the frequency of the oscillator may be tuned (changed) by varying the bias current. FIG. 7 shows the I–V curve of the annular LJJ with one-trapped soliton ($n_{0=}1$). This illustrates the odd series of steps. FIG. 8 shows the radiation frequency ($f_8$) at the $8^{th}$ TFF output, when the LJJ is biased on the first step shown in FIG. 7. For a bias current of 6 mA, $f_8=152.96$ MHz, corresponding to $f_0=39.16$ GHz, in good agreement with the first step voltage in FIG. 7. That is, FIG. 8 shows the range of tunability of the annular LJJ by varying the bias current. The LJJ is biased on the first ZFS.

Figure 9:
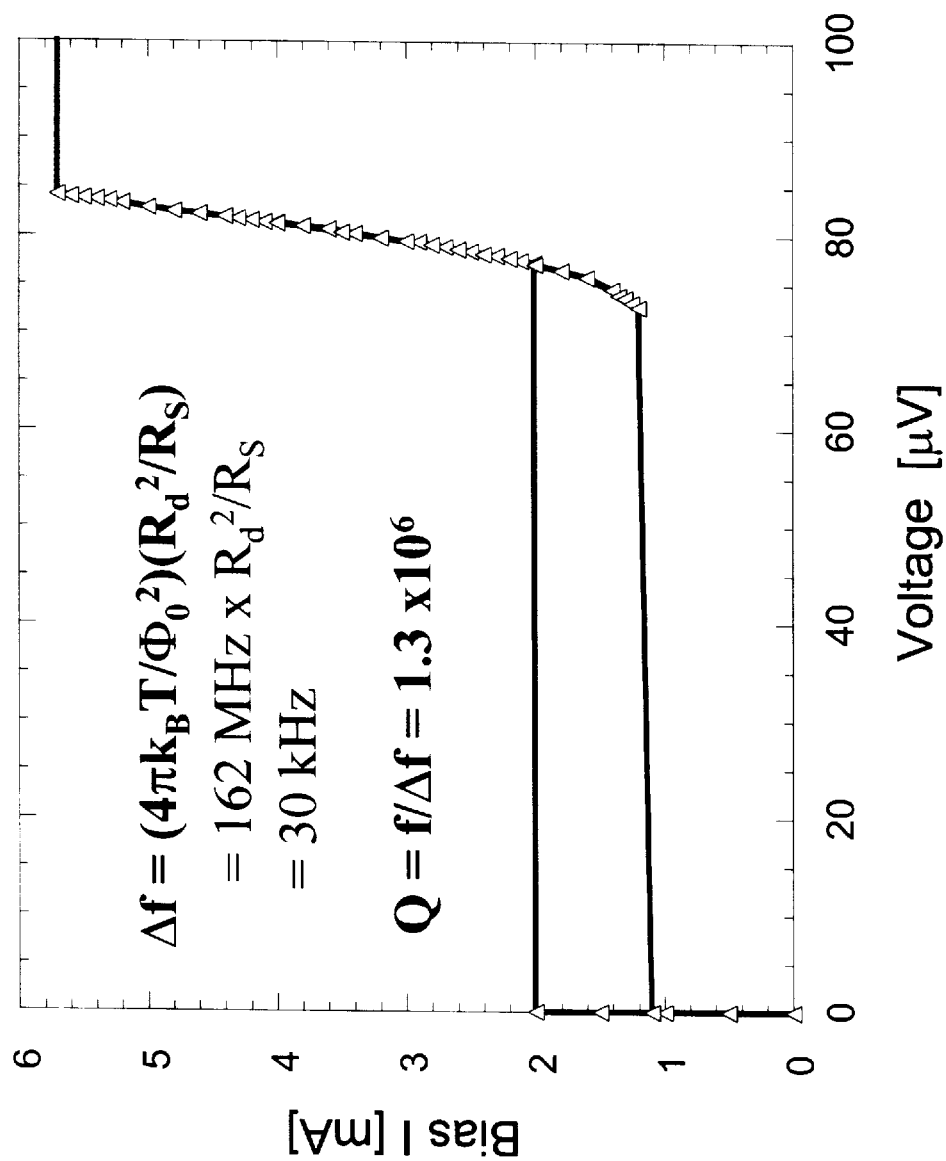
FIG. 9 is an I–V curve of an annular LJJ.

The oscillator's linewidth ($\Delta f$) and quality factor (Q) can be calculated from the I–V curve of the LJJ in the thermal noise limit. The center frequency of the oscillator spectrum was measured at different bias currents. An accurate I–V curve (FIG. 9) can be obtained by converting the frequency to voltage using the Josephson relation. The Josephson relation, $V=f\Phi_0$, is the basis for the voltage standard, and is generally accepted as such. The annular LJJ quality factor of $1.3\times10^6$ is higher than that of the linear LJJ. The linewidth of 30 kHz at a center frequency of 40 GHz translates to a jitter ($\tau_{jitter}=\Delta f/f^2$) of ~0.02 fs. However, this jitter estimate is approximate and the exact value depends not only on the line width but also on the exact shape of the spectrum.

Clock Selector Circuit

Figure 10:
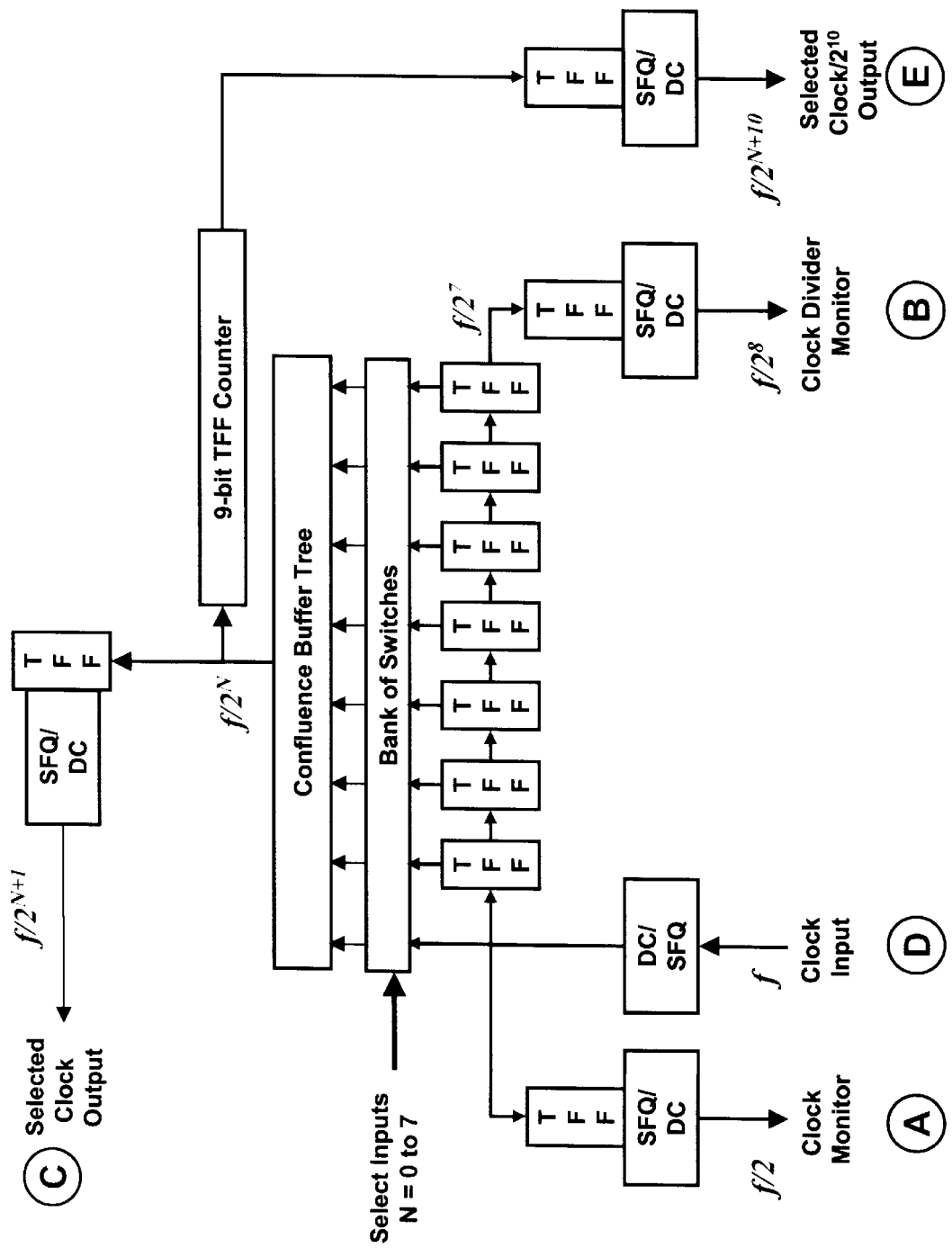
FIG. 10 is a block diagram of a clock selector circuit.
Figure 11:
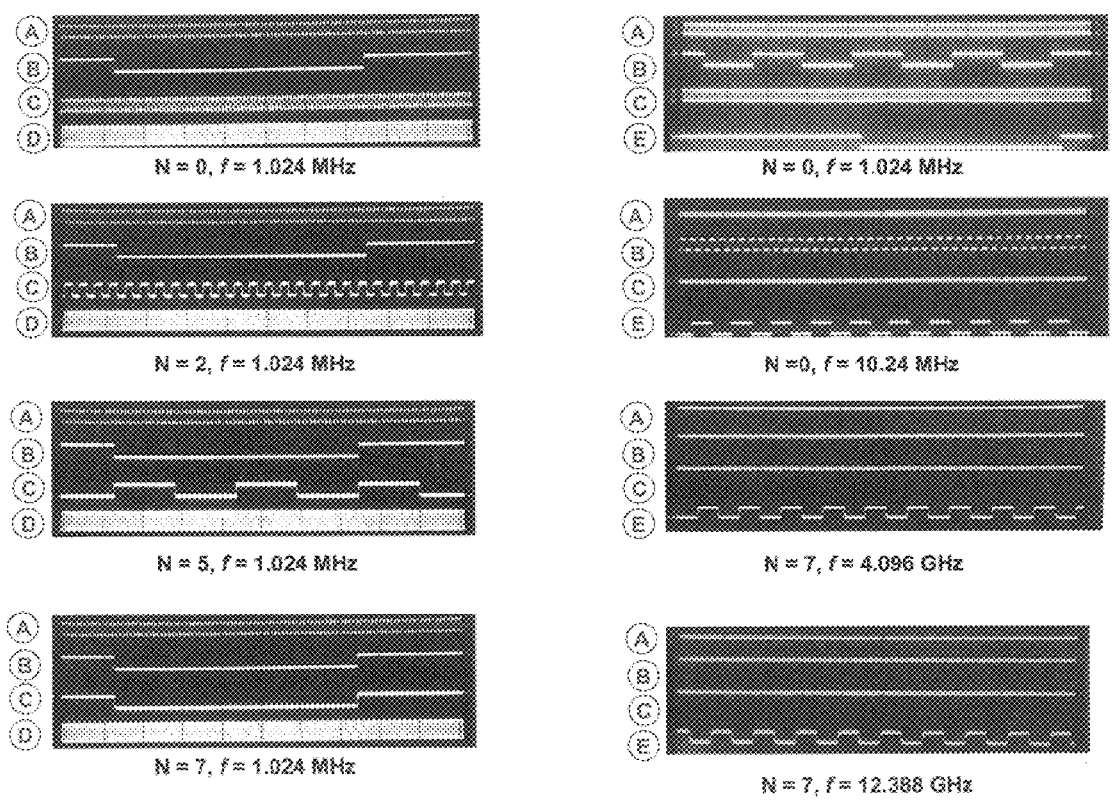
FIG. 11 shows selected clock outputs for the clock selector circuit of FIG. 10.

FIG. 10 is a block diagram of a clock selector circuit. Outputs A and B are respectively f/2 and $f/2^8$ signals. The output denoted by C is a selected clock output and the output denoted by E is the selected clock output following a 512:1 frequency divider. The clock input into the selector circuit is identified by D. The clock selection may be performed by controlling a set of switches shown in the figure. The switch outputs are combined using a confluence buffer tree. This type of circuit enables a wide range of frequencies to be obtained from a master clock with relative ease. The performance of an ADC circuit is usually characterized over a wide range of sampling clock frequencies. In order to incorporate an LJJ on-chip clock into the ADC circuit, a clock-frequency selector circuit was also developed. The clock selector circuit facilitates the circuit characterization as well as improves testability. The clock frequency (e.g., the master clock applied to input D) is successively divided by factors of 2 using a chain of TFFs. The clock selector chooses either the master clock ($f_m$) or one of its binary sub-harmonics, based on the select inputs. Applicants implemented a version of this circuit where 8 different clock frequencies ($f_m/2^N$, N=0,1,2, . . . ,7) can be generated and selected (FIG. 10). A 9-bit TFF counter was added to decimate the selected clock frequency down by a factor of $2^9$ to be able to monitor the outputs (E) on a low bandwidth oscilloscope. This circuit was tested with an external sinewave generator. The DC/SFQ converter produces an SFQ pulse in each external clock cycle. It operated over a wide range of frequencies. FIG. 11 shows selected clock outputs for different select settings and different master clock frequencies.

SFQ Pulse Transport on Transmission Lines for Clock Distribution

Figure 12:
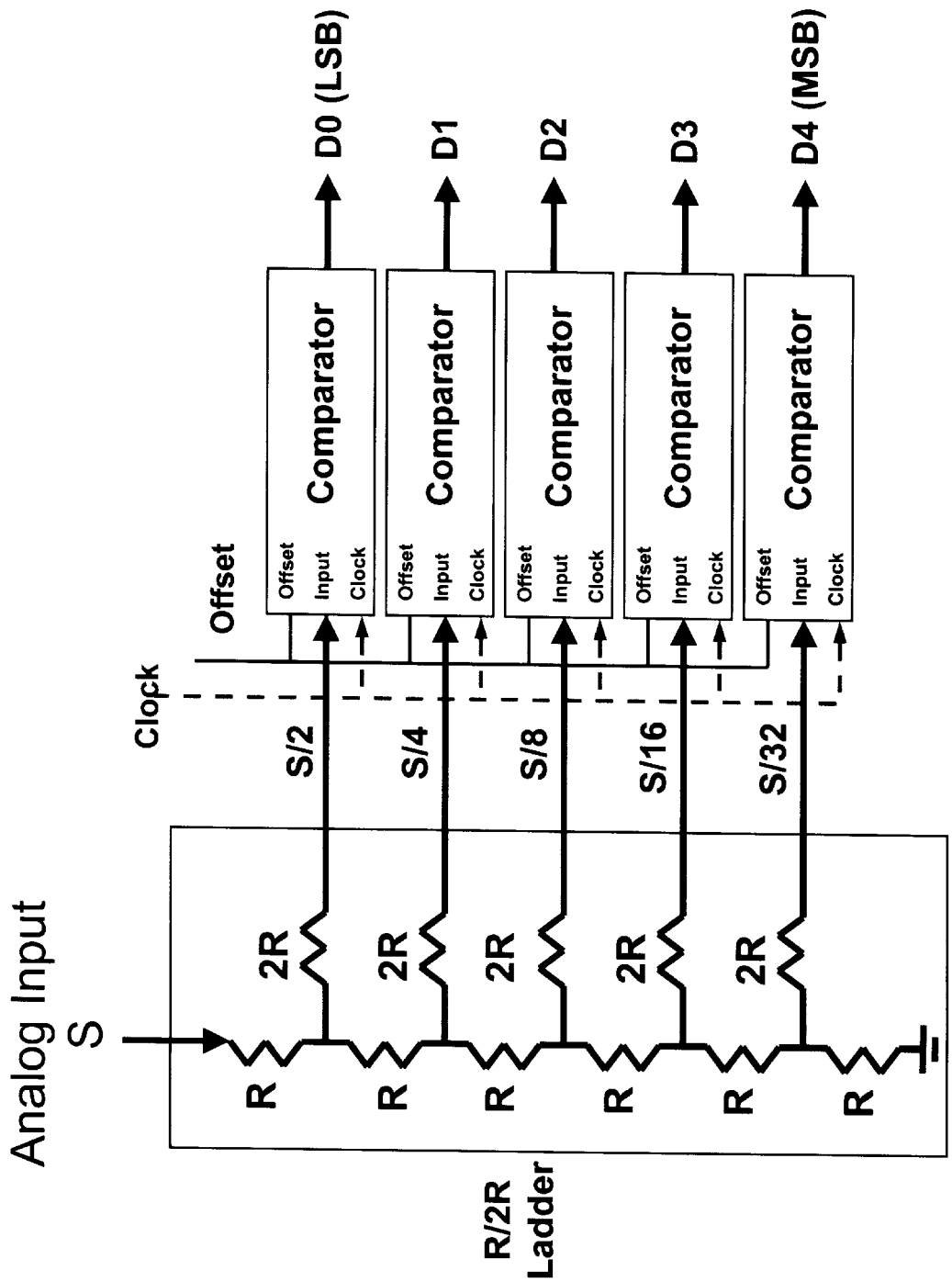
FIG. 12 is a schematic diagram of a ladder network for a flash ADC.

FIG. 12 is a schematic diagram of a flash ADC showing an R/2R ladder and periodic comparators. In the Flash ADC architecture (FIG. 12), the digitization is performed by applying the analog input signal to a set of comparators through a resistive divider ladder that divides the signal by factors of two between successive comparator stages. The R/2R ladder is made with a coplanar waveguide. Therefore, the input signal travels at the speed of light in the medium ($\sim c/\sqrt{\epsilon_r}$, where $\epsilon_r \approx 5$ for the dielectric used in our fabrication process) between the comparators. The clock must arrive at the same time as the signal at every comparator. At present, an external high frequency sinusoidal signal is used to produce the clock. This sinusoidal signal travels on microstrip transmission lines across the comparator. At each comparator this signal is tapped and applied to a local DC/SFQ comparator to produce the requisite SFQ clock.

Since an objective of this invention is to replace this external clock source with an on-chip SFQ clock source, we must ensure that this SFQ clock is distributed at the same speed as the input signal. Ordinarily, in most RSFQ digital circuits the SFQ pulses are transmitted on Josephson transmission lines (JTLs). JTLs are active repeaters. Each JTL section reproduces the input fluxon at its output. The switching delays of each JTL stage quickly add up, rendering the JTL unusable for this purpose.

SFQ pulses were successfully transmitted on a passive transmission line with the characteristic impedance matched to the shunt resistance of a JTL junction. Special transmitter and receiver circuits were implemented at the two ends of this transmission line for effective coupling. Initially, Applicants intended to make a micro-strip transmission line. After further study, Applicants decided to use a stripline (with a top and a bottom ground plane). For the same characteristic impedance, striplines are narrower than microstrip lines (normally almost half as wide). The layout of a circuit used to test SFQ pulse transport on striplines is shown in FIG.

Figure 13A:
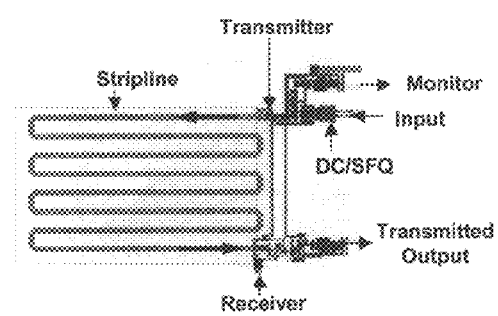
FIGS. 13(a) and 13(b) are, respectively, the layout and corresponding block diagram of a circuit suitable to test the transport of SFQ pulses over a stripline transmission line.

13(a). A block diagram of the layout of the FIG. 13(a) circuit is shown in FIG. 13(b).

Applicants then measured the propagation delay on striplines and JTLs. The delay of JTLs depend on the dc current bias. It is desirable to accurately measure these delays to ensure proper clock distribution on hybrid JTLs and striplines. Direct measurement of the propagation delay is extremely difficult and requires high-speed measurement equipment. Assuming the speed of propagation to be $1.34 \times 10^8$ m/s, the delay is only 7.45 ps/mm. Even a 10 mm long on-chip meander line gives a delay of only 74.5 ps. Applicants came up with an ingenious technique that enabled the delay measurement of both JTLs and the stripline by a single measurement.

Figure 13C:
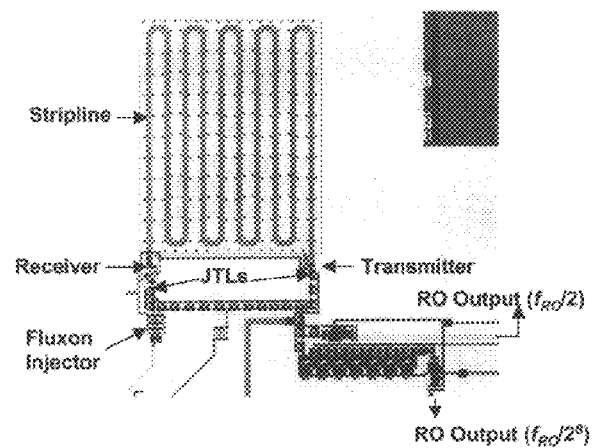
FIGS. 13(c) and 13(d) are, respectively, the layout and corresponding block diagram of a ring oscillator used to calculate propagation delays of striplines and JTL sections.
Figure 13B:
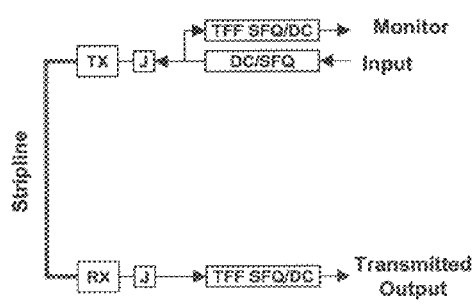
Figure 13D:
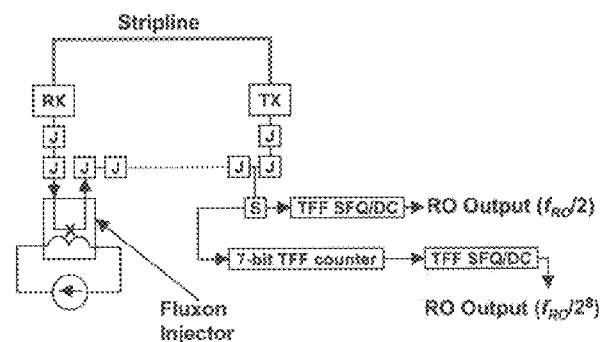

FIG. 13(c) shows the layout and FIG. 13(d) shows the block diagram of a ring oscillator consisting of stripline and JTL sections used to calculate propagation delays. In fact, two hybrid ring oscillators were made, each consisting of a stripline and several JTL stages connected in a closed loop through a fluxon injector circuit (FIG. 13(b)). The two ring oscillators have different number of JTL stages ($n_1$ and $n_2$) and different lengths of stripline ($l_1$ and $l_2$) and produce oscillations at different frequencies ($f_1$ and $f_2$). By solving the set of equations in (3), Applicants calculated the delay per JTL stage ($t_J$) and the delay per unit length of the stripline ($t_S$).

$$n_1 t_J + l_1 t_S = 1/f_1$$
$$n_2 t_J + l_2 t_S = 1/f_2 \qquad (3)$$

Figure 14:
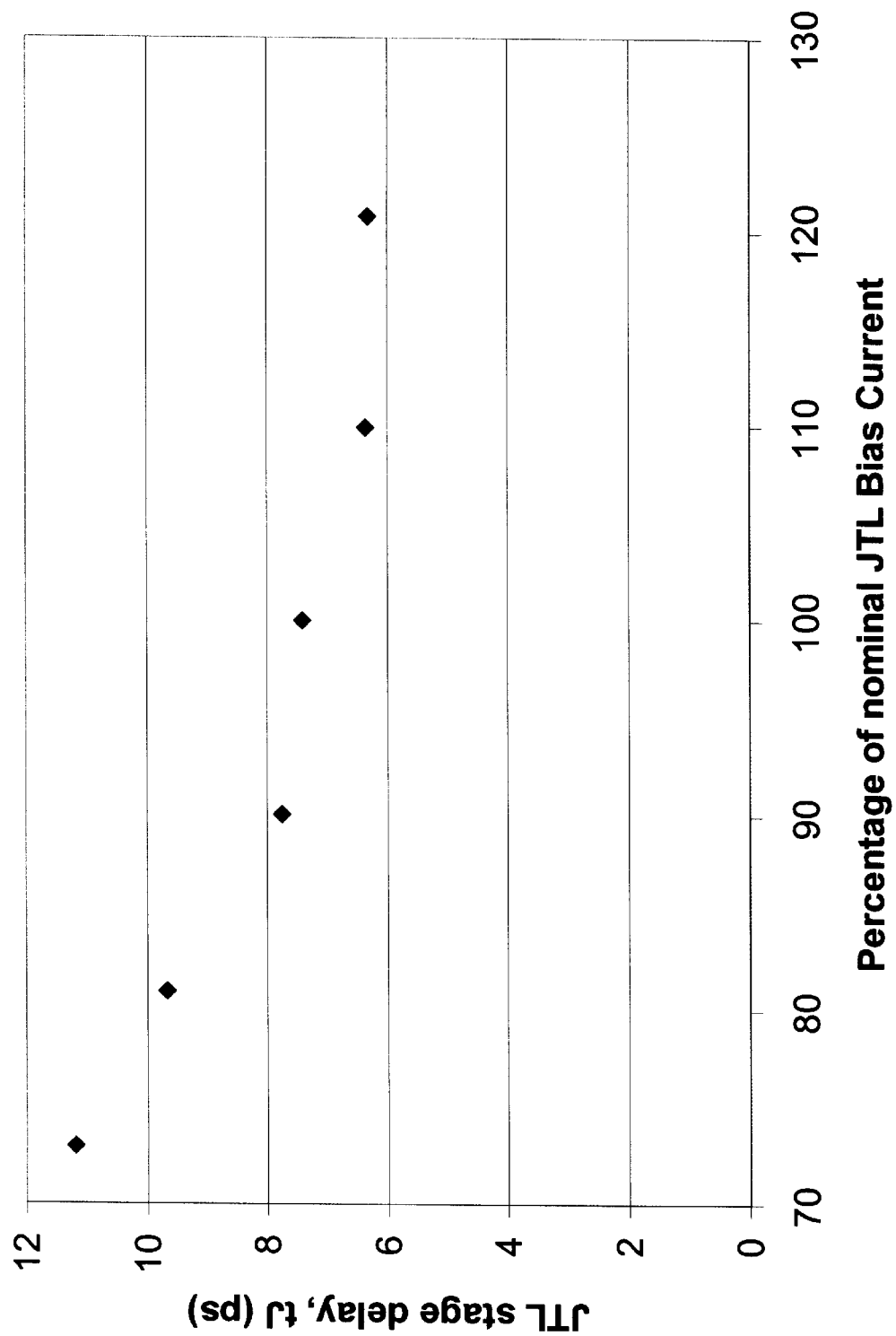
FIG. 14 is a plot of JTL delay as a function of JTL bias.

In this design, $n_1=32$, $n_2=36$, $l_1=11.236$ mm $l_2=19.478$ mm. Applicants measured $f_1$ and $f_2$ under different JTL bias conditions. The nominal JTL bias is $0.75 I_C$, where IC is the junction critical current of the JTL. The circuit operates with more than ±30% bias margins. The delay of one JTL stage is roughly equal to that of a 1 mm stripline. FIG. 14 shows the JTL delay per stage as function of bias current. At nominal bias the delay per stage is 7.4 ps. The length of a JTL stage is usually 30–100 □m. Therefore, a transmission line constructed with JTLs has a delay of 75–250 ps/mm.

Figure 15:
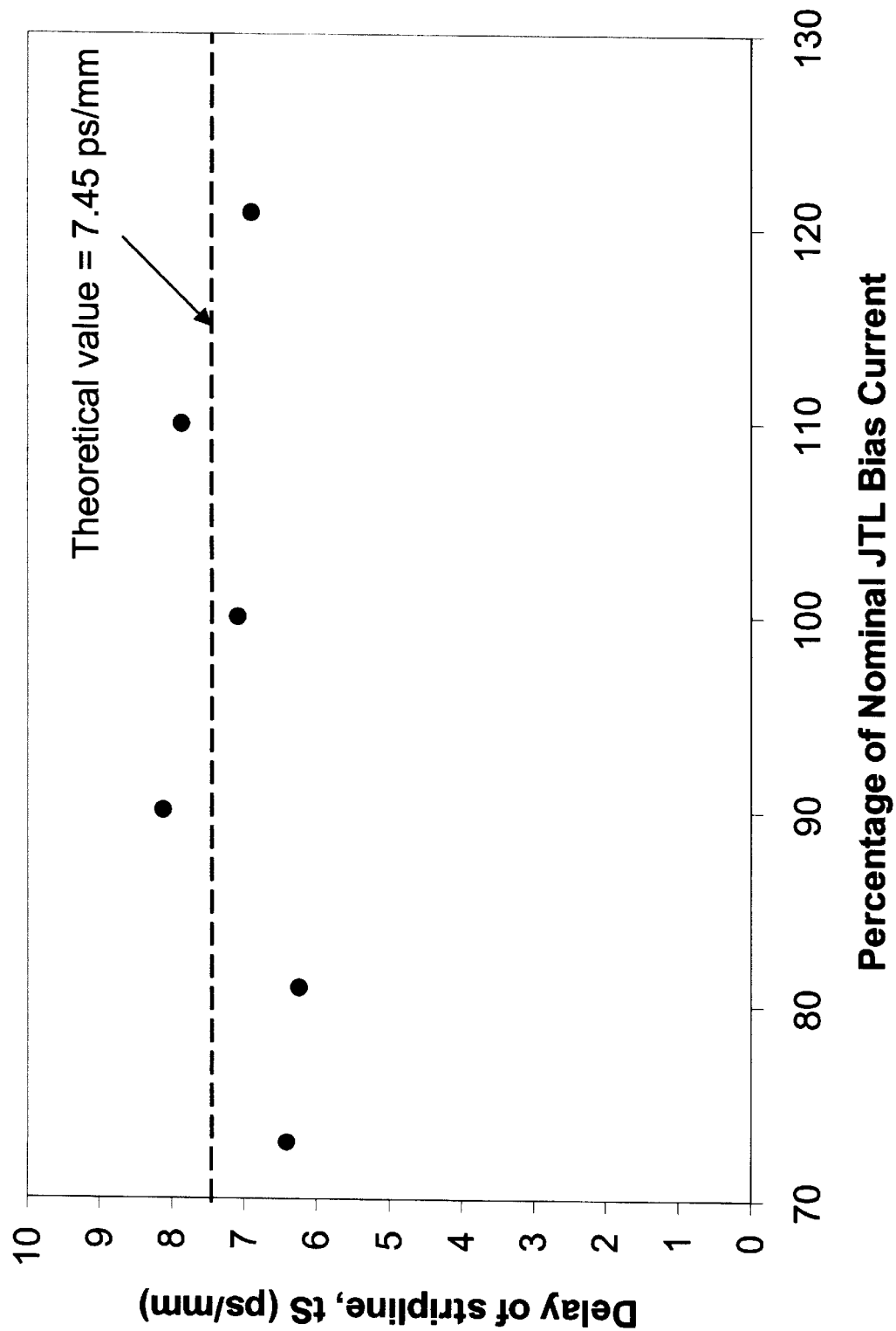
FIG. 15 is a plot illustrating the delay of a strip line as a function of the bias current applied to the line.

The stripline delay per unit length ($t_S$) should be independent of the JTL bias and is expected to be 7.45 ps/mm (FIG. 15). At nominal JTL bias current, $t_S$ was measured to be 7.1 ps/mm. The measurement confirms that the transmission of clock pulses between the comparators is preferably done using a stripline.

Integration of the LJJ clock with Flash ADC

All circuits described in the previous sections (and those to follow) were designed for and fabricated using either: (a) the HYPRES 1 kA/cm² process; or (b) the higher current density (2.5 kA/cm²) process, in order to achieve smaller junction switching times and therefore, higher speed of operation in circuits such as the Flash ADC designs. Applicants also updated the LJJ and the clock selector circuit designs for the 2.5 kA/cm² process. Publications pertaining to these processes are incorporated herein by reference.

Figure 16:
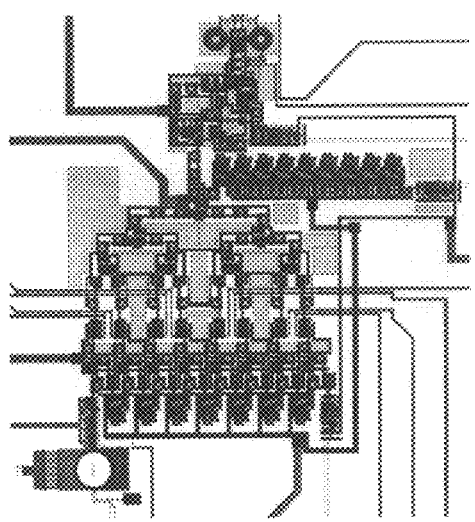
FIG. 16 is a layout and the corresponding block diagram of a circuit integrating an LJJ oscillator with a flash ADC converter.
Figure 16:
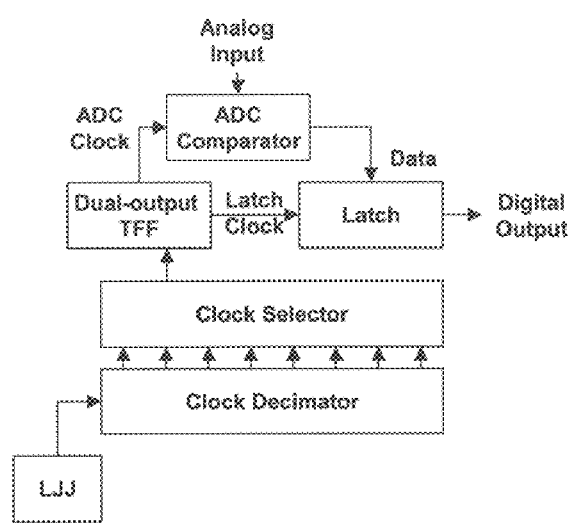
Figure 16A:
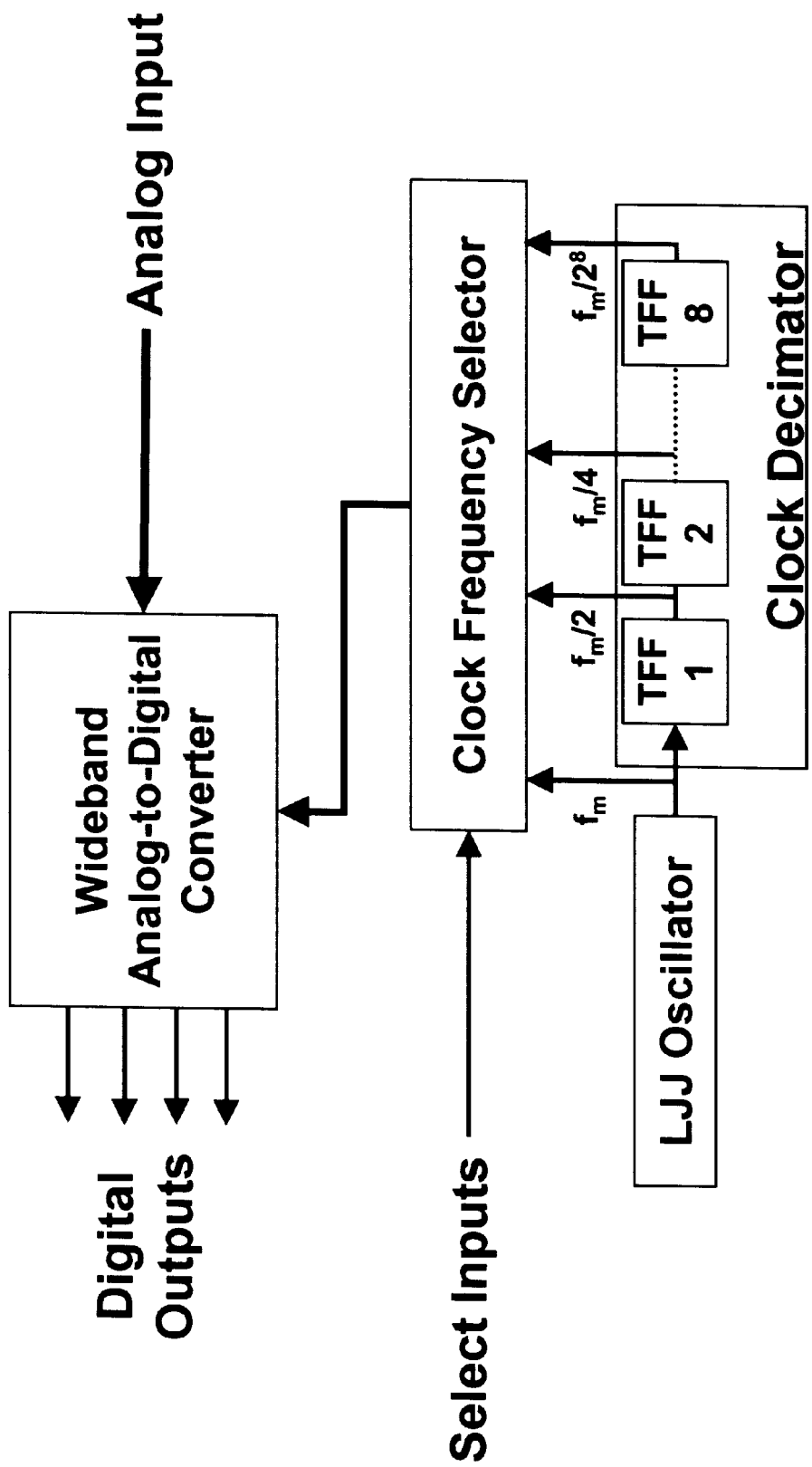
FIG. 16A is a block diagram of a flash ADC with an integrated LJJ clock.

FIG. 16 shows the ADC comparator integrated with a LJJ clock source. The ADC comparator used in this circuit has been extensively tested. Upon clocking, the comparator produces a digital output (an SFQ pulse for "1", and no SFQ pulse for "0") depending on the value of the analog input. The data is stored in a latch awaiting the arrival of a clock pulse. The ADC and the latch clocks must alternate to ensure proper operation. These two clock sequences are produced with a dual-output TFF that routes the incoming clock pulses (from the LJJ through a clock selector circuit) alternately to two outputs. FIG. 16A shows a slightly different version of a flash ADC with an integrated LJJ clock. The clock frequency selector circuit improves circuit testability over a wide range of sampling frequencies.

Fluxon Sender Circuit for LJJ Oscillator

Figure 17A:
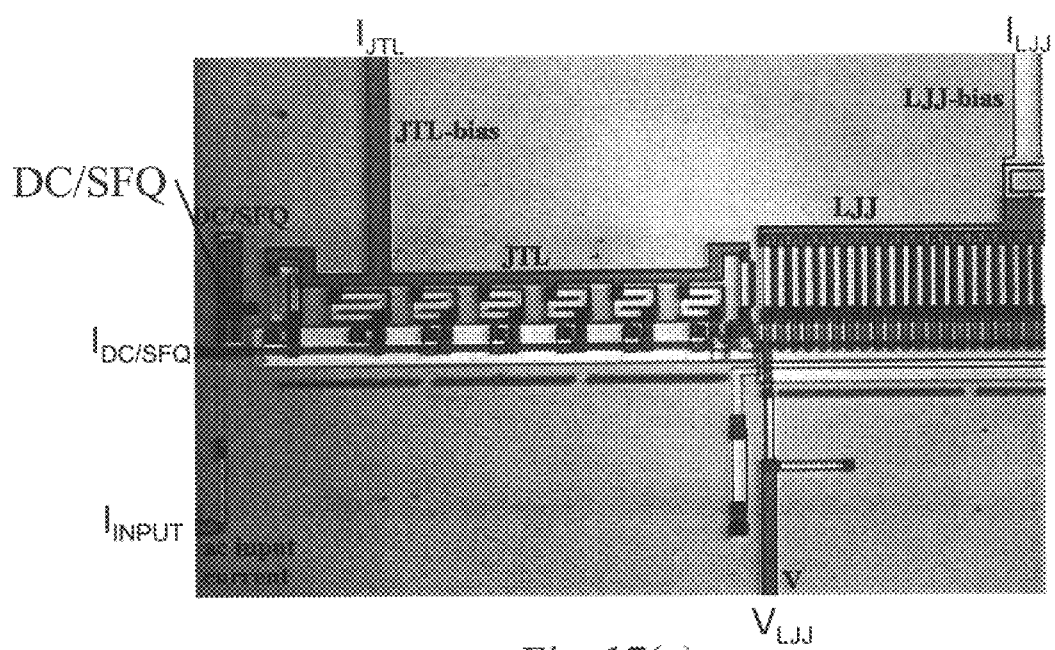
FIGS. 17(a) and 17(b) are respectively an optical micrograph and the corresponding block diagram of a fluxon sender circuit embodying the invention.
Figure 17B:
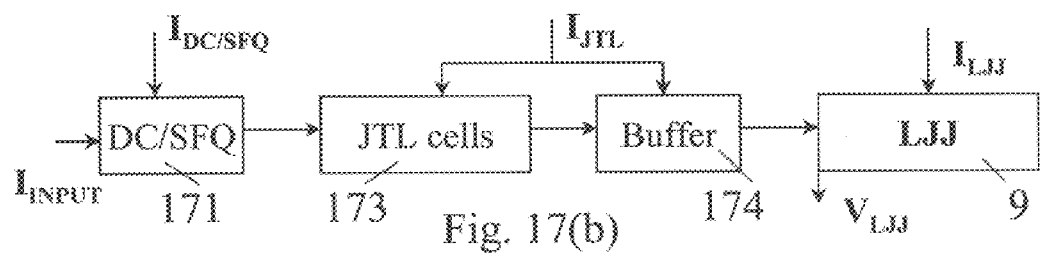

FIG. 17(a) is an optical micrograph of a fluxon sender circuit. FIG. 17(b) is a block diagram of the fluxon sender circuit of FIG. 17(a). The fluxon injection circuit (FIGS. 17(a) and 17(b)) allows introduction of fluxons in a controllable manner to trigger soliton oscillations in an LJJ oscillator (linear or annular). This is the first step towards developing a new technique to perform phase locking of an LJJ oscillator with an external low frequency source.

Figure 18:
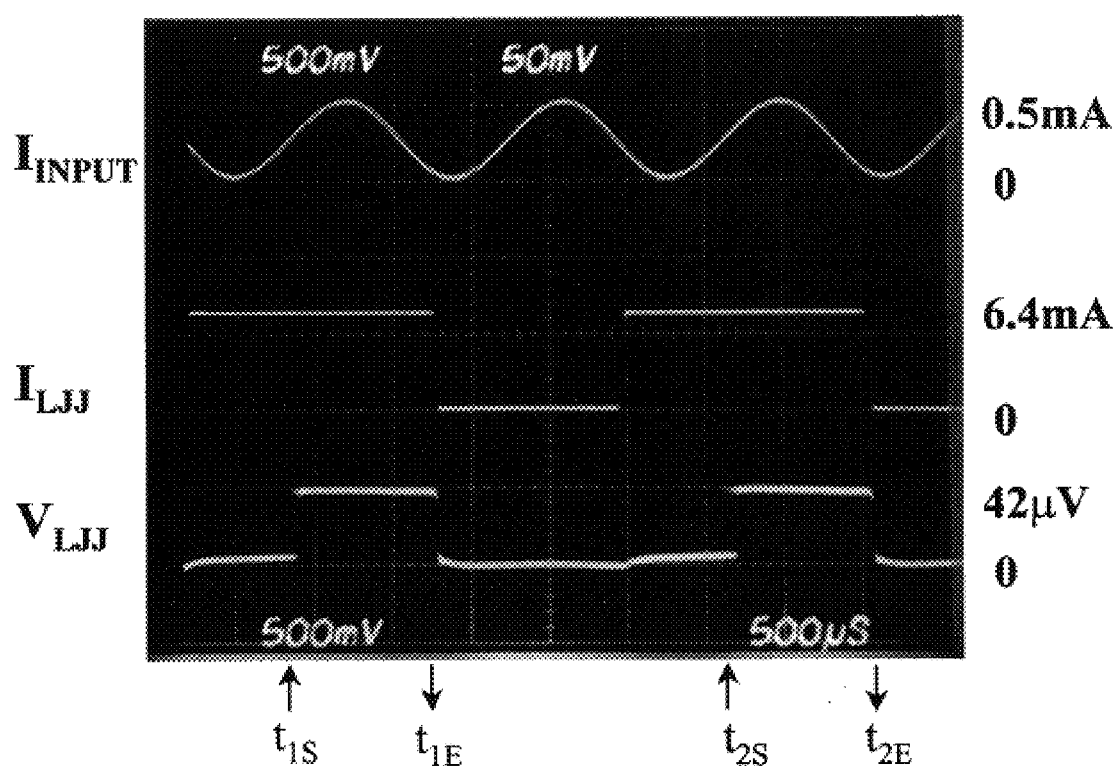
FIG. 18 is a waveform diagram of a fluxon being propagated.

The DC/SFQ bias determines the threshold for the SFQ pulse generation. When the $I_{INPUT}$ exceeds the threshold, an SFQ pulse is produced. The buffer circuit acts like a "diode", allowing fluxon propagation in only one direction. The LJJ is initially in the zero voltage state. When a fluxon is injected into the LJJ oscillator, it switches to a $1^{st}$ resonant state (ZFS1). For a linear LJJ, the fluxon continues to oscillate between the boundaries of the LJJ until its bias current is turned down to zero. For an annular LJJ, the fluxon continues around the ring, as discussed above. This is a new method of introducing fluxons in a long Josephson junction. The injection of 1 and 2 fluxons into a linear LJJ was performed. FIG. 18 shows the oscilloscope waveforms demonstrating the operation of the fluxon sender circuit.

The layout and the circuit diagram for the RSFQ to LJJ fluxon sender is shown in FIGS. 17a and 17b, respectively. The circuit is illustrated using a linear LJJ, but an annular LJJ could be used instead. The long junction (LJJ) 9 is unshunted, i.e., underdamped. This maintains the ultra high-Q factor of long junction oscillator (above $10^5$) at frequency above 10 GHz, as discussed above. Such a high-Q oscillator is very unique and is useful for building a low jitter, on chip clock for high-speed Josephson digital circuits. All RSFQ cells are overdamped. The LJJ 9 is coupled to RSFQ cells on both junction ends, only the input RSFQ circuit is shown in FIG. 17a for ease of illustration. The DC-to-SFQ converter 171 transfers input ac current into dc discrete flux quanta—fluxons which propagate to LJJ 9 via Josephson transmission-line (JTL) cells (J1–J7 in FIG. 17a). A buffer 174 stage between LJJ 9 and JTL 173 is used to prevent fluxons propagate back from LJJ to JTL. A micrograph of the fabricated circuit is shown in FIG. 17a.

The output circuit (not shown in FIG. 17b) is similar to the circuits shown in FIGS. 1A, 1B, 3A1, 3A2. The LJJ 9 may be connected to a multistage RFSQ T-flip-flops via RSFQ transmission line cells. Experiments and simulations demonstrated that the soliton resonance modes in the LJJ 9 are not destroyed by the shunted junctions at both ends.

In the particular embodiment shown in FIGS. 17(a) and 17(b), the circuit was fabricated with a HYPRES Josephson junction process. The LJJ 9 was made 3.5 $\mu$m wide and 300 $\mu$m long (the Josephson penetration length $\lambda_j$ was about 10 $\mu$m). JTL 173 included seven Josephson junctions to form the transmission line. The first two junctions J1–J2 had the junction critical currents of 0.17 mA, and 0.24 mA for J2–J7. The buffer 174 stage had a junction critical current of 0.20 mA (for $J_B$). Very small coupling inductors (about 2 pH) were used between J7 and $J_B$, and between $J_B$ and the long junction.

For LJJ 9 dc biased in the zero-voltage state, an input fluxon at the junction end can excite the first resonance soliton mode—one soliton propagates back and forth inside the junction, showing the $1^{st}$ zero-field step (ZFS1) on the I–V curve. Also, within a certain bias range, two input fluxons could excite the second resonance soliton mode, showing the second zero-field step (ZFS2) on the I–V curve.

The fluxon may be removed from LJJ 9 by setting the LJJ bias to zero. The LJJ then switches to the zero-voltage state.

Results from testing the circuit of FIGS. 17a, 17b are shown in FIG. 18. The input to DC/SFQ converter 171 is a sine-wave current ($I_{input}$). For a fixed cycle, $t_{1s}$ depends on the amplitude of $I_{Input}$. The current bias for the DC/SFQ is around 0.236 mA. At t1s, a fluxon is generated from DC-to-SFQ converter 171. The fluxon propagates through the JTL cells. The SFQ voltage pulse enters LJJ 9 (at the left end in FIG, 17b). This switches LJJ 9 from the zero-voltage state (OV) to the first zero-field-step (42 $\mu$V) which corresponds to the single soliton resonance mode. LJJ 9 was biased at 6.4 mA, which is about 70% of the current height value for the first zero-field-step of the LJJ. Therefore, at t1s, the long junction voltage switches from zero to 42 $\mu$V. It takes less than a few picoseconds (10–12 seconds) to excite the resonance modes after the SFQ generated pulse hits the long junction end of LJJ 9.

The first resonance step voltage is given by long junction length and the losses in the junction, $V_f=\Phi_0$ u/L, where $\Phi_0$ is the flux quantum, u is the soliton velocity (determined by the quasiparticle loss and surface loss) and L is the junction length. In a particular embodiment, the JTL bias current was $I_{JTL}=3.1$ mA and no external magnetiic field was applied to the LJJ.

Applicants used the circuit of FIGS. 17a, 17b to send two fluxons into LJJ 9 and excite the second soliton resonance modes. A larger dc bias current (0.43 mA) was then used for the DC/SFQ converter to generate two SFQ pulses at the same time.

At $t_{1E}$, the LJJ bias was set to zero, and the fluxon in LJJ 9 disappeared, V→0. The fluxon sending and removing process may be repeated as shown for times $t_{2S}$ and $t_2E$ in FIG. 18.

The circuit of FIGS. 17(a), 17(b) demonstrates the sending of SFQ pulses from RSFQ cells into a long Josephson junction and exciting the first soliton resonance mode. Since an underdamped long junction (e.g., LJJ 9) has much narrower linewidth (Q~$10^5$) for the soliton modes compared with a damped Josephson junction and RSFQ ring oscillator (Q~$10^3$), it has a well defined phase and very low oscillating jitter. A soliton in the LJJ also has much higher pulse voltage than a fluxon in a damped JTL. Potential applications both for RF and digital logic circuits may be developed from this RSFQ/JJ interface circuit. Two applications are discussed below.

1) On-chip LJJ Clock Application

If LJJs are implemented as the on-chip master clocks for all RSFQ circuits on a multi-chip system (such as the superconducting circuits in the petaflops-scale computer), similar input circuits may be used to trigger the clocks in the system. In the Hybrid Technology Multi-Threshold (HTMT) project, superconductor processors have 512 multi-chip modules (MCM), with each MCM having 50 chips. Providing clocks between 60 to 120 GHz to all these chips with external sources will be very expensive. The approach, using clocks embodying the invention, has the following advantages:

- low-cost, integration solution,
- very low-jitter sources,
- low power dissipation for the system since no RF cables are needed for the clock inputs,
- no cross-talk from the clock inputs to the circuit,
- much less packaging work for those input RF cables,
- possibility to have multi clock outputs with different defined phases and frequencies from each LJJ oscillator.

On-chip LJJ oscillators can also be used for RSFQ-based high-speed ADC circuits and other RSFQ.

Based on the innovated circuit, instantaneous clock recovery and data retiming circuits can be built for handling burst-mode data in data communication networks. Only one data bit is required to recover the data phase and start clock oscillating. Since the Q-factor of the long junction oscillator is in the order of $10^6$, the time jitter can be estimated to be around $\delta t=(1/f)IQ_0=(1/10$ GHz$)/10^6 =-$ I fs. Even reported superconducting RSFQ ring-oscillator has a Q around $10^3$. This ultra-high Q also leads to a very high "silence parameter" N—the maximum number of successive identical non-return-to-zero (NRZ) bits permitted in the incoming digital signal. Also, the resonance frequency of the LJJ oscillator can be easily designed in the frequency range of 10 to 100 GHz, by changing the length of the junction. All these unique features are unattainable by advanced semiconductor technology. Therefore, in accordance with the invention, a high-performance, ultra-low power dissipation fiber optical receiver can be built at 100 Gbit/s per channel. Each receiver channel can be implemented into 5 mm Nb chips. Although a 4K cryo-cooler is needed for such a system, it is possible to implement 10 channels (1 Tb/s bandwidth) 100 Gbit/s into a single cooler. Such a multi-channel receiver will be of great value to the telecommunications industry for the possible implementation in dense wavelength division multiplexing (WDM) transmission systems. The cost and performance of such a Tbit/s system will have a great advantage compared with those built using semiconductor technologies. The low-Q, high-power and low-speed of CMOS are prohibitive for such an application.

Figure 19:
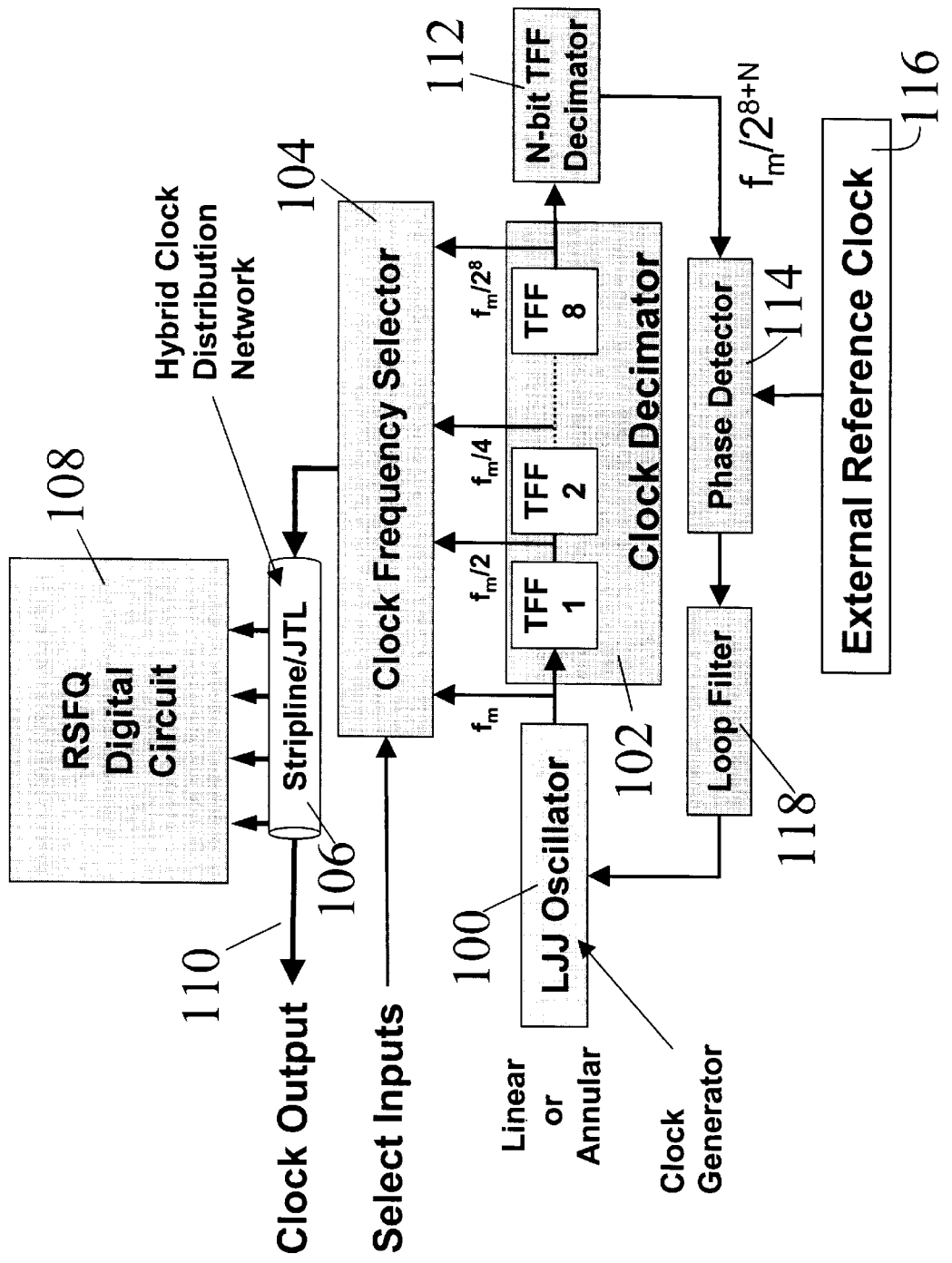
FIG. 19 is a block diagram of an LJJ oscillator and a phase locked loop (PLL) to synchronize the on-chip clock generator with an external low frequency reference.

FIG. 19 is a block diagram representation illustrating the use of a linear or annular LJJ oscillator in a phase locked loop system. FIG. 19 shows an LJJ oscillator 100 producing a master clock "$f_m$". The master clock is supplied to a clock decimator 102 to generate binary subharmonics of the master clock frequency. The master clock $f_m$ and various outputs of the clock decimator are supplied to a clock frequency selector 104. Select input signals applied to the clock frequency selector 104 determine the clock frequency supplied to a stripline/JTL distribution network 106. The stripline/JTL distribution network 106 supplies signals to an RSFQ digital circuit system 108 and a selected clock output 110. An output of the clock decimator (the output of TFF8 in FIG. 19) is supplied to an additional N-bit TFF decimator 112. An output of decimator 112 is coupled to an input of a phase detector 114 to which is applied an external reference clock 116. An output of phase detector 114 is supplied to an input of a loop filter 118 whose output is fed back to an input of LJJ oscillator 100 to synchronize the on-chip clock generator (i.e., LJJ oscillator 100 ) with an external low frequency reference clock 116.

Figure 20A:
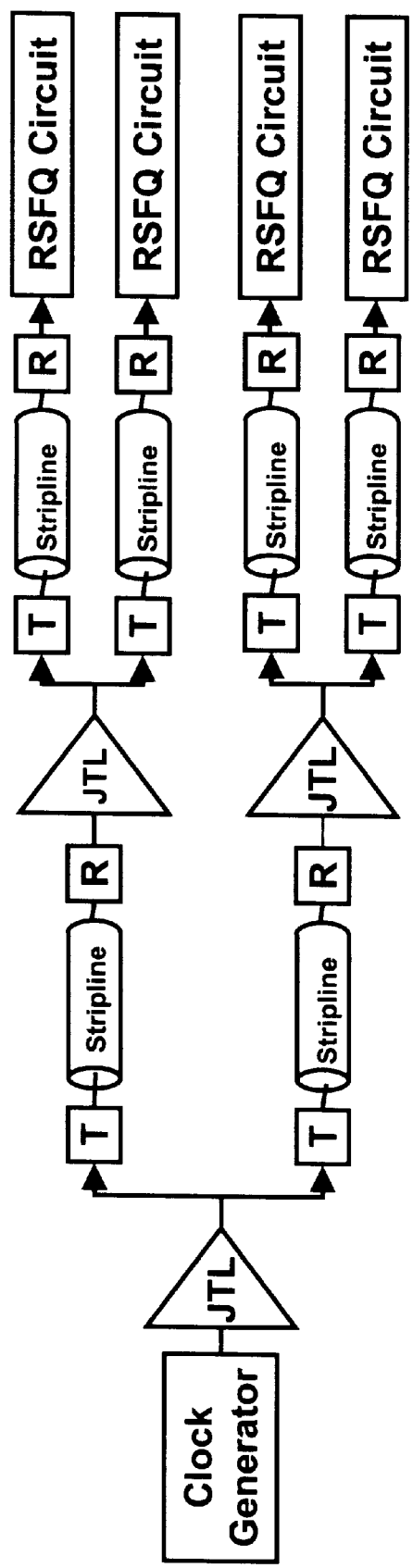
FIGS. 20(a) and (b) illustrate two different clock distribution schemes.
Figure 20B:
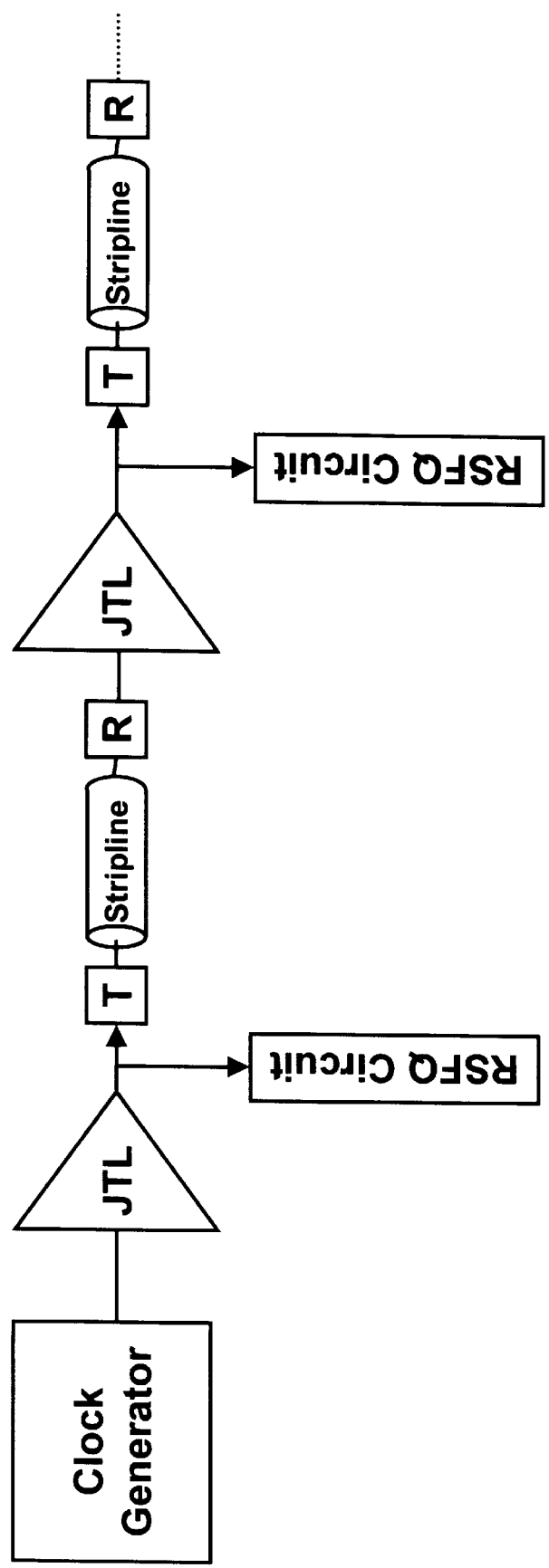

FIGS. 20(a) and 20(b) are two examples of clock distribution schemes useful in systems embodying the invention. The use of impedance-matched striplines allows ballistic transport of SFQ clock pulses. Josephson transmission lines are used as active transmission lines or repeaters. Propagation delay in the striplines is about twenty to thirty times smaller than in the JTLs. Therefore, striplines are used for long distance clock distribution while JTL stages are inserted as buffers/amplifiers/splitters. The symbols T and R in these figures represent transmitter and receiver circuits that should be used on either side of a stripline.

Identified Markets and Potential Commercial Applications

Superconducting electronics is potentially superior to other technologies for a number of applications because of its advantages in high speed, low power consumption and accuracy. It is clear that applications where these advantages outweigh the drawbacks of cooling will make this technology commercially viable in the future. The most promising near-term commercial application of this technology is in wide-bandwidth analog-to-digital converters. Over the past few years, superconducting high-speed and high-resolution analog-to-digital converter (ADC) circuits have achieved a level of performance unmatched in any other technology. It is also important to note that this performance is far from what the technology is ultimately capable of achieving. Applicants developed a novel on-chip clocking scheme to simplify the system requirements of an instrument, based on the superconducting wideband ADC.

One aspect of the invention is focused on one such instrument, the multi-GHz transient digitizer. The proposed clocking scheme, however, is versatile and can be used for any other rapid-single-flux-quantum (RSFQ) digital circuits. The need for generation and distribution of a stable, low-jitter on-chip clock is well known in the superconducting electronics community. It is also widely acknowledged that it is extremely challenging to produce a high-speed clock that has low-jitter and long-term phase stability. For a digitizer used for fast transient measurements, long-term phase stability is not important and different clock sources can be used directly. However, an ADC operating continuously requires that the phase of the clock does not drift over time.

One application of the invention includes a high-frequency, on-chip, clock module for RSFQ circuits and a wideband digitizer with on-chip clock. The clock module is versatile in its potential use. One of the potential uses of this module will be in 100 GHz RSFQ processors for the HTMT (Hybrid Technology MultiThreaded) project to build a petaflops-scale computer. Another application for the invention includes a 20–50 Gsample/s transient digitizer instrument.

Transient Digitizer—the Market and the Competition

There is a growing need for ultra-wide bandwidth digitizers to study fast transient phenomena.

In many cases, scientific experiments suffer due to the lack of availability of a suitable transient digitizer. For example, to achieve inertial confinement fusion (ICF), the target (a tiny pellet filled with deuterium and tritium) is simultaneously irradiated with many pulsed laser beams (128 beams for the National Ignition Facility and 60 beams for University of Rochester's OMEGA). To achieve fusion, the number of laser beams should be as large as possible to ensure uniform energy density on the target. The laser pulse shapes of all the beams must be closely matched. This is a single-shot pulse, lasting a few nanoseconds with a rise time of hundreds of picoseconds. At present, there is no suitable transient digitizer that can provide the required bandwidth and resolution required for measuring the laser pulse shapes. Therefore, streak cameras are currently used for laser pulse diagnostics.

A streak camera uses the photoelectric effect to convert the incoming optical signal into free electrons which are then imaged on a CCD array. The custom-built streak camera, P510, used in the OMEGA project has 8-bits of resolution and has a bandwidth of 7–10 GHz. It can be used to measure up to 10 channels and can be digitized in one instrument if one is willing to sacrifice 3–4 bits of resolution. Streak cameras are very expensive. However, the streak camera is prone to signal distortions during measurement due to inherent non-linearities. It is also susceptible to neutron radiation damage causing some acquisitions to be "washed out" in the neutron-rich environment of a fusion reactor. The radiation hardness of superconducting electronics is well known.

Targeted Applications

Some applications requiring a transient digitizer with high bandwidth are as follows:

Diagnostics to measure laser inertial confinement target emissions

The analysis of the time evolution of thermonuclear target energetics requires a wide-bandwidth digitizer.

Diagnostics to measure the time evolution of energy output of solid state lasers—For inertial confinement, dozens of lasers must all pre-heat and ignite a tiny target at the same time, and with the same intensity.

Diagnostics to measure the bunch profile in particle accelerators—The digitizer could make real-time measurements of the beam position and time profile to obtain optimum accelerator performance. Such measurements are especially critical for eliminating wasteful "beam-in-gap" particles that reduce accelerator efficiency, and also reduce the lifetime of accelerator parts by vastly increasing their radioactivity.

Identifying pulses from particle detectors for nuclear and high-energy physics—The digitizer could be instrumental in characterizing details of the pulse shapes and resolving multiple hits.

Glossary of Acronyms and Abbreviations
ADC Analog-to-Digital Converter
BNL Brookhaven National Laboratory
DC/SFQ DC to Single-Flux-Quantum Converter
fs femtosecond ($10^{-15}$ second)
GHz GigaHertz ($10^9$ Hertz)
HTMT Hybrid Technology MultiThreaded
ICF Inertial Confinement Fusion
JJ Josephson Junction
JTL Josephson Transmission Line
LJJ Long Josephson Junction
ps picosecond ($10^{-12}$ second)
PLL Phase Locked Loop
RSFQ Rapid Single Flux Quantum
SFQ Single Flux Quantum
SFQ/DC Single-Flux-Quantum to DC Converter
TFF Toggle Flip-Flop
XOR Exclusive OR
ZFS Zero Field Step

What is claimed is:

1. An oscillator circuit comprising:
a long Josephson Junction (LJJ);
means for supplying a bias current to the LJJ;
means for supplying a control current and magnetically coupling the current to the LJJ for causing the LJJ to generate pulse signals; and
at least one connection to the LJJ for obtaining pulse signals from the LJJ.

2. An oscillator circuit as claimed in claim 1 wherein the LJJ is an annular LJJ.

3. An oscillator circuit as claimed in claim 2, wherein a multiplicity of taps are connected along the annular LJJ for obtaining clock pulses having the same frequency but different phases.

4. An oscillator circuit as claimed in claim 1, wherein the means for supplying a control current includes means for varying the amplitude of the current and the oscillating frequency of the oscillator in discrete steps.

5. An oscillator circuit as claimed in claim 2, wherein the amplitude of the bias current may be varied to operate the annular junction on either odd numbered steps or on even numbered steps.

6. An oscillator circuit as claimed in claim 2, wherein the bias current is a direct current (d.c.) which flows through the annular LJJ.

7. An oscillator circuit as claimed in claim 2, wherein the control current is a direct current (d.c.) which flows in a control line overlying the annular LJJ to create a magnetic field in the annular LJJ.

8. An oscillator as claimed in claim 1 wherein the LJJ is a linear LJJ.

9. An oscillator as claimed in claim 8 wherein a first connection is made at one end of the linear LJJ to obtain first signals having a first frequency and wherein a second connection is made at the other end of the linear LJJ for obtaining second signals having said first frequency but having 180° phase shift relative to said first signals.

10. An oscillator as claimed in claim 8, wherein said at least one connection to the LJJ for obtaining pulse signals from the LJJ includes a Josephson transmission line terminating in a buffer for passing the pulses unidirectionally.

11. An oscillator circuit comprising:
a long Josephson Junction (LJJ);
means for supplying a bias current to the LJJ;
means for supplying a control current and magnetically coupling the current to the LJJ for causing the generation of pulse signals within the LJJ; and
at least one tap connected to the LJJ for obtaining pulse signals from the LJJ.

12. An oscillator circuit as claimed in claim 11 wherein a multiplicity of taps are connected along the LJJ for obtaining clock pulses having the same frequency but different phases.

13. An oscillator circuit as claimed in claim 11, wherein the means for supplying a control current includes means for varying the amplitude of the current and the oscillating frequency of the oscillator in discrete steps.

14. An oscillator circuit as claimed in claim 11, wherein the amplitude of the bias current may be varied to operate the LJJ on either odd numbered steps or on even numbered steps.

15. An oscillator circuit as claimed in claim 11, wherein the bias current is a direct current (d.c.) which flows through the LJJ.

16. An oscillator circuit as claimed in claim 11, wherein the control current is a direct current (d.c.) which flows in a control line overlying the LJJ to create a magnetic field in the LJJ.

17. An oscillator circuit comprising:
an undamped long Josephson junction (LJJ) having a hysteretic current-voltage (I–V) characteristic;
current biasing means for supplying a bias current to the LJJ for increasing the junction current above its critical value and causing the LJJ to switch from the superconductive state to a resistive state along a first step, said current biasing means also including means for selectively decreasing the junction current to a predetermined value, above zero, and then increasing the junction current to cause the LJJ to switch to the normal state along a path other than said first step for varying and controlling the frequency of oscillation; and
at least one connection to the LJJ for obtaining pulse signals from the LJJ.

18. An oscillator circuit as claimed in claim 17 wherein the LJJ is a linear LJJ.

19. An oscillator circuit as claimed in claim 18 wherein the LJJ is an annular LJJ.

20. An oscillator circuit as claimed in claim 18 wherein the oscillator circuit also includes means for supplying a control current which is magnetically coupled to the LJJ, the control current and the bias current combining to cause the LJJ to generate pulse signals.

21. An oscillator as claimed in claim 17 wherein the connection to the LJJ for obtaining pulse signals from the LJJ includes rapid single flux quantum (RSFQ) circuits connected to the LJJ.

22. An oscillator as claimed in claim 21 wherein the RSFQ circuits include frequency divider stages.

23. An oscillator as claimed in claim 17 wherein the connection to the LJJ includes a Josephson transmission line (JTL) and a buffer stage for ensuring unidirectional propagation of pulses from the LJJ to a load.

24. A combination comprising:
a long Josephson junction (LJJ) oscillator;
a single flux quantum (SFQ) circuit having an input and an output;
means for applying a time varying voltage waveform to the input of the SFQ circuit for causing the SFQ circuit to generate a pulse at its output;
a Josephson transmission line (JTL) having an input and an output; said JTL being connected at its input to the output of the SFQ circuit for propagating a pulse generated by the SFQ circuit and producing a pulse corresponding thereto at said JTL output;
a buffer circuit having an input and an output, said buffer including means for propagating a pulse unidirectionally from its input to its output; and
means connecting the input of the buffer to the output of the JTL and the output of the buffer to the LJJ oscillator for controlling the oscillation of the LJJ oscillator in response to the receipt of a pulse from the SFQ circuit.

25. A combination as claimed in claim 24, wherein said LJJ oscillator includes a linear LJJ.

26. A combination as claimed in claim 24, wherein said LJJ oscillator includes an annular LJJ.

* * * * *